US012148767B2

(12) United States Patent
Jeong et al.

(10) Patent No.: US 12,148,767 B2
(45) Date of Patent: Nov. 19, 2024

(54) DISPLAY DEVICE AND TILED DISPLAY DEVICE INCLUDING THE SAME

(71) Applicant: Samsung Display Co., LTD., Yongin-si (KR)

(72) Inventors: Se Hoon Jeong, Suwon-si (KR); Seung Wook Kwon, Hwaseong-si (KR); Jae Sik Kim, Hwaseong-si (KR); Woo Yong Sung, Seoul (KR); Seo Yeon Lee, Namyangju-si (KR); Ung Soo Lee, Seoul (KR); Ja Min Lee, Seoul (KR); Jeong Seok Lee, Yongin-si (KR); Seung Gun Chae, Hwaseong-si (KR); Seung Yeon Chae, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 272 days.

(21) Appl. No.: 17/400,792

(22) Filed: Aug. 12, 2021

(65) Prior Publication Data
US 2022/0077195 A1 Mar. 10, 2022

(30) Foreign Application Priority Data

Sep. 4, 2020 (KR) .......................... 10-2020-0112715

(51) Int. Cl.
H01L 27/12 (2006.01)
G02F 1/1333 (2006.01)
(Continued)

(52) U.S. Cl.
CPC ...... *H01L 27/1266* (2013.01); *G02F 1/13336* (2013.01); *G02F 1/136209* (2013.01);
(Continued)

(58) Field of Classification Search
CPC . H01L 27/1266; H01L 27/1218; H10K 59/18; G02F 1/136209
See application file for complete search history.

(56) References Cited

U.S. PATENT DOCUMENTS 6,970,219 B1 * 11/2005 Hermann ............ G02F 1/13452
349/122
2015/0187807 A1 * 7/2015 Tsuruoka .............. H01L 27/124
257/347

(Continued)

FOREIGN PATENT DOCUMENTS

KR 0164360 3/1999
KR 10-2006-0072737 6/2006

*Primary Examiner* — Peter M Albrecht
(74) *Attorney, Agent, or Firm* — KILE PARK REED & HOUTTEMAN PLLC

(57) ABSTRACT

A display device includes a display layer comprising pixels, each of the pixels having at least one thin-film transistor, a connection line electrically connected to the at least one thin-film transistor, the connection line being exposed on a lower surface of the display layer through a first contact hole formed in the display layer, a barrier layer disposed on the lower surface of the display layer and including a second contact hole connected to the first contact hole, a lead line disposed on a lower surface of the barrier layer and electrically connected to the connection line through the second contact hole, a pad part disposed on the lower surface of the barrier layer and electrically connected to the lead line, and a lower film overlapping the lower surface of the barrier layer and the lead line.

19 Claims, 28 Drawing Sheets

(51) Int. Cl.
*G02F 1/1362* (2006.01)
*H01L 25/16* (2023.01)

(52) U.S. Cl.
CPC .......... *H01L 25/162* (2013.01); *H01L 25/167* (2013.01); *H01L 27/124* (2013.01)

(56) References Cited

U.S. PATENT DOCUMENTS

2015/0286457 A1* 10/2015 Kim ...................... G06F 3/1446
345/1.3
2017/0179159 A1* 6/2017 Kawata ................. H01L 27/124

\* cited by examiner

DISPLAY DEVICE AND TILED DISPLAY DEVICE INCLUDING THE SAME

CROSS REFERENCE TO RELATED APPLICATION(S)

This application claims priority to and benefits of Korean Patent Application No. 10-2020-0112715 under 35 U.S.C. § 119 filed on Sep. 4, 2020, in the Korean Intellectual Property Office, the entire contents of which are incorporated herein by reference.

BACKGROUND

1. Technical Field

The disclosure relates to a display device and a tiled display device including the same.

2. Description of the Related Art

The demand for display devices for displaying images is increasing in various forms due to the increasing development of the information society. For example, display devices are being applied to various electronic devices such as smartphones, digital cameras, notebook computers, navigation devices, and smart televisions. The display devices may be flat panel display devices such as liquid crystal display devices, field emission display devices, and organic light emitting display devices. Of the flat panel display devices, a light emitting display device may include a light emitting element that enables each pixel of a display panel to emit light by itself. Thus, the light emitting display device can display an image without a backlight unit providing light to the display panel.

In a case that a display device is manufactured to have a large size, a defect rate of light emitting elements may increase due to an increase in the number of pixels, and productivity or reliability may be reduced. To solve these problems, a tiled display device may be implemented to provide a large screen by connecting a plurality of relatively small display devices. The tiled display device may include a boundary part called a seam between the display devices due to a non-display area or a bezel area of each of the display devices adjacent to each other. In a case that one image is displayed on the entire screen, the boundary part between the display devices gives a sense of separation of the entire screen, thereby reducing the degree of immersion in the image.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device and a tiled display device including the same, which can eliminate a sense of separation between a plurality of display devices and improve the degree of immersion in images by preventing a coupling or connecting area or a non-display area between the display devices from being recognized.

Aspects of the disclosure also provide a display device and a tiled display device including the same, which can increase the degree of freedom in processing a polyimide substrate in the process of manufacturing the display device and reduce a defect rate of a lower film that supports a display layer in which a separate polyimide substrate may not be required.

However, aspects of the disclosure are not restricted to the ones set forth herein. The above and other aspects of the disclosure will become more apparent to one of ordinary skill in the art to which the disclosure pertains by referencing the detailed description of the disclosure given below.

According to an embodiment, a display device may include a display layer comprising a plurality of pixels, each of the plurality of pixels having at least one thin-film transistor; a connection line electrically connected to the at least one thin-film transistor, the connection line being exposed on a lower surface of the display layer through a first contact hole formed in the display layer; a barrier layer disposed on the lower surface of the display layer and including a second contact hole connected to the first contact hole; a lead line disposed on a lower surface of the barrier layer and electrically connected to the connection line through the second contact hole; a pad part disposed on the lower surface of the barrier layer and electrically connected to the lead line; and a lower film overlapping the lower surface of the barrier layer and the lead line.

The display device may further include a flexible film disposed on a surface of the pad part; and a source driver that supplies a source voltage to the pad part and is disposed on a surface of the flexible film.

The lower film may include at least one of acrylic resin, epoxy resin, phenolic resin, polyamides resin, unsaturated polyesters resin, polyphenylene ethers resin, polyphenylene sulfides resin, and benzocyclobutene resin.

The barrier layer may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The display layer may include a buffer layer disposed on another surface of the pad part opposite the surface of the pad part; a gate insulating layer disposed on the buffer layer; and an interlayer insulating film disposed on the gate insulating layer. The connection line may be disposed on the interlayer insulating film and may be exposed on the lower surface of the display layer through the first contact hole penetrating the interlayer insulating film, the gate insulating layer and the buffer layer.

The at least one thin-film transistor may include a source electrode disposed on the buffer layer, and the display layer may comprise a connection electrode disposed on the interlayer insulating film to electrically connect the source electrode to the connection line.

The display device may further comprise a light blocking film including a light blocking material and overlapping a lower surface of the lower film.

The display device may further include a base part disposed on edges of the lower surface of the barrier layer, wherein the base part may surround the lower film.

The base part may include polyimide.

The pad part may be disposed between the lower film and the base part.

The display device may further include a flexible film disposed on a surface of the pad part; and a source driver that supplies a source voltage to the pad part and is disposed on a surface of the flexible film.

According to an embodiment, a display device may include a display layer comprising a plurality of pixels, each of the plurality of pixels having at least one thin-film transistor; a connection line electrically connected to the at least one thin-film transistor, the connection line being exposed on a lower surface of the display layer through a contact hole formed in the display layer; a pad part disposed on the lower surface of the display layer and spaced apart from the contact hole; a lead line disposed on the lower surface of the display layer and electrically connected between the connection line and the pad part; and a lower film overlapping the lower surface of the display layer and the lead line.

The display device may further include a flexible film disposed on a surface of the pad part; and a source driver that supplies a source voltage to the pad part and is disposed on a surface of the flexible film.

According to an embodiment, a display device may include a display layer comprising a plurality of pixels, each of the plurality of pixels having at least one thin-film transistor; a connection line electrically connected to the at least one thin-film transistor, the connection line being exposed on a lower surface of the display layer through a first contact hole formed in the display layer; a barrier layer disposed on the lower surface of the display layer and including a second contact hole connected to the first contact hole; a first lower film disposed on a lower surface of the barrier layer and including a third contact hole connected to the second contact hole; a lead contact part disposed in the second contact hole and the third contact hole and electrically connected to the connection line; a lead line disposed on a lower surface of the first lower film and electrically connected to the lead contact part; a pad part disposed on the lower surface of the first lower film and electrically connected to the lead line; and a second lower film overlapping the lower surface of the first lower film and the lead line.

Each of the first lower film and the second lower film may include at least one of acrylic resin, epoxy resin, phenolic resin, polyamides resin, unsaturated polyesters resin, polyphenylene ethers resin, polyphenylene sulfides resin, and benzocyclobutene resin.

The barrier layer may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

A lower surface of the lead contact part may be coplanar with the lower surface of the first lower film.

According to an embodiment, a tiled display device may include a plurality of display devices comprising a plurality of display areas having pixels; and a connecting area disposed between adjacent ones of the plurality of display areas. Each of the plurality of display devices may include a display layer comprising a plurality of pixels, each of the plurality of pixels having at least one thin-film transistor; a connection line electrically connected to the at least one thin-film transistor, the connection line being exposed on a lower surface of the display layer through a first contact hole formed in the display layer; a barrier layer disposed on the lower surface of the display layer and including a second contact hole connected to the first contact hole; a lead line disposed on a lower surface of the barrier layer and electrically connected to the connection line through the second contact hole; a pad part disposed on the lower surface of the barrier layer and electrically connected to the lead line; and a lower film overlapping the lower surface of the barrier layer and the lead line.

Each of the plurality of display devices may include a light blocking film including a light blocking material and overlapping a lower surface of the lower film.

Each of the plurality of display devices may include a base part disposed on edges of the lower surface of the barrier layer, wherein the base part surrounds the lower film.

In a display device and a tiled display device including the same according to embodiments, a separate substrate made of polyimide may not be included, and a lower film may support a display layer and protect a lower surface of the display device. In the tiled display device, a contact hole penetrating a polyimide substrate may not be formed in the process of manufacturing the display device, and a part of the polyimide substrate may not be etched. Therefore, since the tiled display device may not require all processes for precision processing of the polyimide substrate in the process of manufacturing the display device, the degree of freedom in processing the polyimide substrate can be increased.

In a display device and a tiled display device including the same according to embodiments, since a lower film may be formed through a printing process or a coating process using an organic material, a lower surface of the display device can be planarized, and a defect rate of the lower film can be reduced. In the tiled display device, since the lower film may be formed using an organic material having fluidity, a step difference of the lower film can be removed, and generation of bubbles or creation of an area to which the lower film may not be attached can be prevented compared with when the lower film may be formed using a lamination process.

However, the effects of the embodiments are not restricted to the ones set forth herein. The above and other effects of the embodiments will become more apparent to one of ordinary skill in the art to which the embodiments pertain by referencing the detailed description and the claims.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

Figure 1:
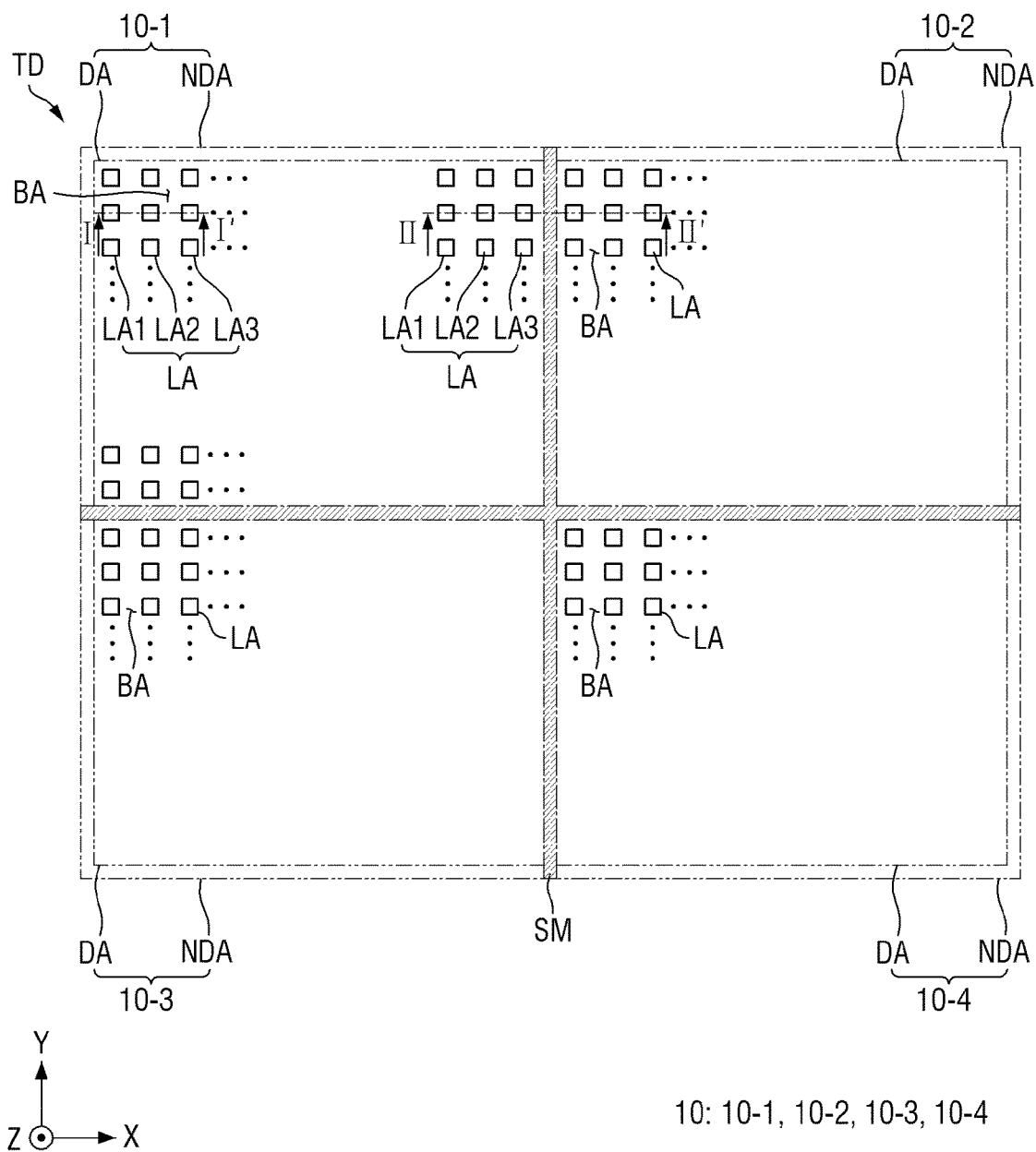
FIG. 1 is a plan view of a tiled display device according to an embodiment.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the implementations or embodiments disclosed herein. It is apparent, however, that various embodiments may be practiced without these details or with one or more equivalent arrangements. In other instances, structures and devices may be shown in block diagram form in order to avoid unnecessarily obscuring various embodiments. Further, various embodiments may be different, but do not have to be exclusive. For example, shapes, configurations, and characteristics of an embodiment may be used or implemented in another embodiment without departing from the scope of the disclosure.

Unless otherwise specified, the illustrated embodiments are to be understood as providing features of varying detail of some or a number of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be substantially perpendicular to one another, or may represent different directions that may not be perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or about 90 degrees or at other orientations), and, as such, the spatially relative descriptors used herein interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," "has," and/or "having," and/or variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some or a number of embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some or a number of functions and a processor (for example, one or more programmed microprocessors and associated circuitry) to perform other functions. Also, each block, unit, and/or module of some or a number of embodiments may be physically separated into two or more interacting and discrete blocks, units, and/or modules without departing from the scope of the disclosure. Further, the blocks, units, and/or modules of some or a number of embodiments may be physically combined into more complex blocks, units, and/or modules without departing from the scope of the disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a tiled display device TD according to an embodiment.

Referring to FIG. 1, the tiled display device TD may include a plurality of display devices 10. The display devices 10 may be arranged or disposed in a lattice shape, but the disclosure is not limited thereto. The display devices 10 may be connected to each other in a first direction (X-axis direction) or a second direction (Y-axis direction), and the tiled display device TD may have a specific or predetermined shape. For example, the display devices 10 may have the same size, but the disclosure is not limited thereto. For another example, the display devices 10 may have different sizes.

Each of the display devices 10 may be shaped substantially like a rectangle including long sides and short sides. The long sides or short sides of the display devices 10 may be connected to each other. Some or a number of the display devices 10 may be disposed at an edge of the tiled display device TD to form a side of the tiled display device TD. Some or a number of other ones of the display devices 10 may be disposed at corners of the tiled display device TD and may form two adjacent sides of the tiled display device TD. The other ones of the display devices 10 may be disposed inside of the tiled display device TD and surrounded by other display devices 10.

Each of the display devices 10 may include a display area DA and a non-display area NDA. The display area DA may include a plurality of pixels to display an image. The non-display area NDA may be disposed around the display area DA to surround or be adjacent to the display area DA and may not display an image.

The overall shape of the tiled display device TD may be a substantially planar shape, but the disclosure is not limited thereto. The tiled display device TD may also have a three-dimensional (3D) shape to provide a 3D effect to a user. For example, in a case that the tiled display device TD has a 3D shape, at least some or a number of the display devices 10 may have a substantially curved shape. For another example, the display devices 10 may each have a substantially planar shape but may be connected to each other at a predetermined angle so that the tiled display device TD can have a 3D shape.

The tiled display device TD may include a coupling area SM disposed between a plurality of display areas DA. The coupling area SM may also be a connecting area SM. The tiled display device TD may be formed by connecting the respective non-display areas NDA of adjacent display devices 10. The display devices 10 may be connected to each other through a coupling or connecting member or an adhesive member disposed in the coupling area SM. A distance between the respective display areas DA of the display devices 10 may be small enough to make the coupling area SM between the display devices 10 unrecognizable by a user. External light reflectance of the display area DA of each of the display devices 10 and external light reflectance of the coupling area SM between the display devices 10 may be substantially equal. Therefore, the tiled display device TD may eliminate a sense of separation between the display devices 10 and improve the degree of immersion in images by preventing the coupling area SM between the display devices 10 from being recognized by a user.

Each of the display devices 10 may include a plurality of pixels arranged or disposed along a plurality of rows and a plurality of columns in the display area DA. Each of the pixels may include a light emitting area LA defined by a pixel defining layer or a bank and may emit light having a predetermined peak wavelength through the light emitting area LA. For example, the display area DA of each of the display devices 10 may include first through third light emitting areas LA1 through LA3. Each of the first through third light emitting areas LA1 through LA3 may be an area where light generated by a light emitting element of a display device 10 is emitted to the outside of the display device 10.

Each of the first through third light emitting areas LA1 through LA3 may emit light having a predetermined peak wavelength to the outside of the display device 10. The first light emitting area LA1 may emit light of a first color, the second light emitting area LA2 may emit light of a second color, and the third light emitting area LA3 may emit light of a third color. For example, the light of the first color may be red light having a peak wavelength in a range of about 610 nm to 650 nm, the light of the second color may be green light having a peak wavelength in a range of about 510 nm to about 550 nm, and the light of the third color may be blue light having a peak wavelength in a range of about 440 nm to about 480 nm. However, the disclosure is not limited thereto.

The first through third light emitting areas LA1 through LA3 may be sequentially and repeatedly arranged or disposed along the first direction (X-axis direction) of the display area DA. For example, the area of the first light emitting area LA1 may be larger than the area of the second light emitting area LA2, and the area of the second light emitting area LA2 may be larger than the area of the third light emitting area LA3. For another example, the area of the first light emitting area LA1, the area of the second light emitting area LA2, and the area of the third light emitting area LA3 may be substantially equal.

The display area DA of each display device 10 may include a light blocking area BA surrounding the light emitting areas LA. The light blocking area BA may prevent color mixing of light emitted from the first through third light emitting areas LA1 through LA3.

The tiled display device TD may include first through fourth display devices 10-1, 10-2, 10-3, and 10-4. The number and coupling relationship of the display devices 10 are not limited to the embodiment of FIG. 1. The number of display devices 10 may be determined by the size of each of the display devices 10 and the tiled display device TD.

Figure 2:
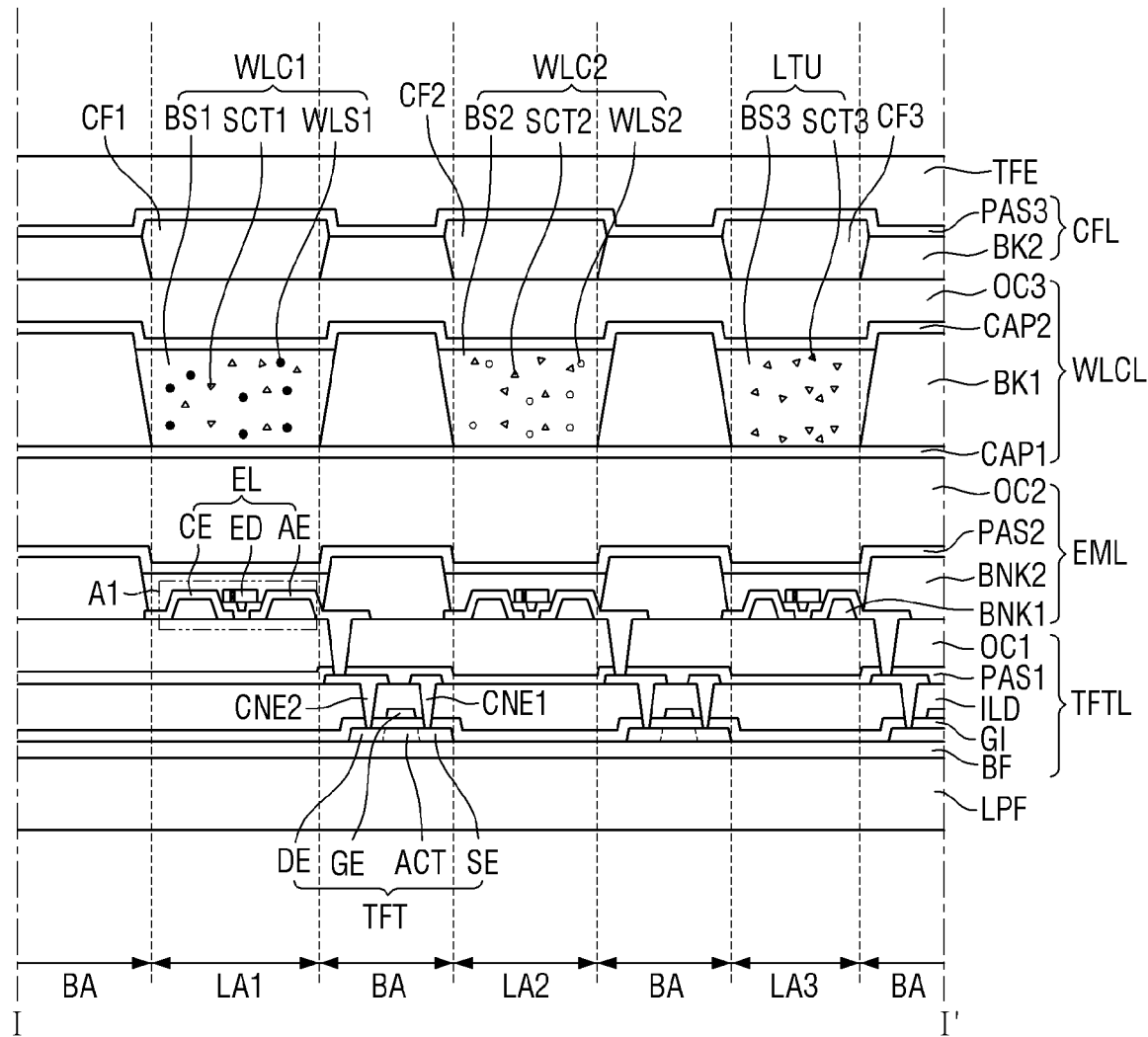
FIG. 2 is a schematic cross-sectional view taken along line I-I' of FIG. 1.
Figure 2:
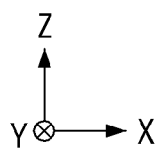

FIG. 2 is a schematic cross-sectional view taken along line I-I' of FIG. 1.

Referring to FIG. 2, the display area DA of a display device 10 may include the first through third light emitting areas LA1 through LA3. Each of the first through third light emitting areas LA1 through LA3 may be an area where light generated by a light emitting diode ED of a corresponding pixel is emitted to the outside of the display device 10.

The display device 10 may include a lower film LPF, a display layer DPL, and an encapsulation layer TFE.

The lower film LPF may support the display layer DPL and protect a lower surface of the display device 10. For example, the lower film LPF may include at least one of acrylic resin, epoxy resin, phenolic resin, polyamides resin, unsaturated polyesters resin, polyphenylene ethers resin, polyphenylene sulfides resin, and benzocyclobutene resin or a combination thereof. The lower film LPF may have flexible properties so as to be bendable, foldable or rollable, but the disclosure is not limited thereto.

The display layer DPL may be disposed on the lower film LPF. The display layer DPL may include a thin-film transistor layer TFTL, a light emitting element layer EML, a wavelength conversion layer WLCL, and a color filter layer CFL.

The thin-film transistor layer TFTL may be disposed on the lower film LPF. The thin-film transistor layer TFTL may include a buffer layer BF, thin-film transistors TFT, a gate insulating layer GI, an interlayer insulating film ILD, first connection electrodes CNE1, second connection electrodes CNE2, a first passivation layer PAS1, and a first planarization layer OC1.

The buffer layer BF may be disposed on the lower film LPF. The buffer layer BF may include an inorganic material that can prevent penetration of air or moisture. For example, the buffer layer BF may include a plurality of inorganic layers alternately stacked each other.

The thin-film transistors TFT may be disposed on the buffer layer BF and may form respective pixel circuits of a plurality of pixels. For example, the thin-film transistors TFT may be driving transistors or switching transistors of the pixel circuits. Each of the thin-film transistors TFT may include a semiconductor region ACT, a gate electrode GE, a source electrode SE, and a drain electrode DE.

The semiconductor region ACT, the source electrode SE, and the drain electrode DE may be disposed on the buffer layer BF. The semiconductor region ACT may be overlapped by the gate electrode GE in a thickness direction and insulated from the gate electrode GE by the gate insulating layer GI. The source electrode SE and the drain electrode DE may be formed by making the material of the semiconductor region ACT conductive.

The gate electrode GE may be disposed on the gate insulating layer GI. The gate electrode GE may overlap the semiconductor region ACT with the gate insulating layer GI interposed or disposed between them.

The gate insulating layer GI may be provided or disposed on the semiconductor regions ACT, the source electrodes SE, and the drain electrodes DE. For example, the gate insulating layer GI may cover or overlap the semiconductor regions ACT, the source electrodes SE, the drain electrodes DE and the buffer layer BF and insulate the semiconductor regions ACT from the gate electrodes GE. The gate insulating layer GI may include contact holes through which the first and second connection electrodes CNE1 and CNE2 may pass.

The interlayer insulating film ILD may be disposed on the gate electrodes GE. For example, the interlayer insulating film ILD may include contact holes through which the first and second connection electrodes CNE1 and CNE2 may pass. Here, the contact holes of the interlayer insulating film ILD may be connected to the contact holes of the gate insulating layer GI.

The first and second connection electrodes CNE1 and CNE2 may be disposed on the interlayer insulating film ILD and spaced apart from each other. The first connection electrodes CNE1 may electrically connect data lines or driving voltage lines to the source electrodes SE of the thin-film transistors TFT. The first connection electrodes CNE1 may electrically contact the source electrodes SE through the contact holes provided or disposed or formed in the gate insulting layer GI and the interlayer insulating film ILD.

The second connection electrodes CNE2 may electrically connect the drain electrodes DE of the thin-film transistors TFT and first electrodes AE of light emitting elements EL. The second connection electrodes CNE2 may electrically contact the drain electrodes DE through the contact holes provided or disposed or formed in the gate insulating layer GI and the interlayer insulating film ILD.

The first passivation layer PAS1 may be provided or disposed on the first and second connection electrodes CNE1 and CNE2 to protect the thin-film transistors TFT. For example, the first passivation layer PAS1 may include contact holes through which the first electrodes AE of the light emitting elements EL may pass.

The first planarization layer OC1 may be provided or disposed on the first passivation layer PAS1 to planarize the top of the thin-film transistor layer TFTL. For example, the first planarization layer OC1 may include contact holes through which the first electrodes AE of the light emitting elements EL may pass. Here, the contact holes of the first planarization layer OC1 may be connected to the contact holes of the first passivation layer PAS1. The first planarization layer OC1 may include an organic material.

The light emitting element layer EML may include the light emitting elements EL, first banks BNK1, a second bank BNK2, a second passivation layer PAS2, and a second planarization layer OC2.

The light emitting elements EL may be provided or disposed on the thin-film transistors TFT. Each of the light emitting elements EL may include the first electrode AE, a second electrode CE, and the light emitting diode ED.

The first electrode AE may be provided or disposed on the first planarization layer OC1. For example, the first electrode AE may be disposed on a first bank BNK1 disposed on the first planarization layer OC1 to cover or overlap the first bank BNK1. The first electrode AE may overlap one of the first through third light emitting areas LA1 through LA3 defined by the second bank BNK2. The first electrode AE may be electrically connected to the drain electrode DE of a thin-film transistor TFT to receive a driving current. The first electrode AE may be, but is not limited to, an anode of each light emitting element EL.

The second electrode CE may be disposed on the first planarization layer OC1 and spaced apart from the first electrode AE. For example, the second electrode CE may be disposed on a first bank BNK1 disposed on the first planarization layer OC1 to cover or overlap the first bank BNK1. The second electrode CE may overlap one of the first through third light emitting areas LA1 through LA3 defined by the second bank BNK2. For example, the second electrode CE may receive a common voltage supplied to all pixels. The second electrode CE may be, but is not limited to, a cathode of each light emitting element EL.

The light emitting diode ED may be disposed on the first planarization layer OC1 between the first electrode AE and the second electrode CE. An end of the light emitting diode ED may be electrically connected to the first electrode AE, and the other end of the light emitting diode ED may be electrically connected to the second electrode CE. A plurality of light emitting diodes ED may include active layers having the same or similar material to emit light of the same wavelength band or light of the same color. Light emitted from the first through third light emitting areas LA1 through LA3 may have the same color. For example, the light emitting diodes ED may emit light of the third color or blue light having a peak wavelength in a range of about 440 nm to about 480 nm. Therefore, the light emitting element layer EML may emit light of the third color or blue light.

The second bank BNK2 may be disposed on the first planarization layer OC1 to define the first through third light emitting areas LA1 through LA3. For example, the second bank BNK2 may surround each of the first through third light emitting areas LA1 through LA3, but the disclosure is not limited thereto. The second bank BNK2 may separate and insulate the respective first electrodes AE or second electrodes CE of the light emitting elements EL. The second bank BNK2 may be disposed in the light blocking area BA.

The second passivation layer PAS2 may be disposed on the light emitting elements EL and the second bank BNK2. The second passivation layer PAS2 may cover or overlap the light emitting elements EL and protect the light emitting elements EL. The second passivation layer PAS2 may prevent damage to the light emitting elements EL by preventing penetration of impurities such as moisture or air from the outside.

The second planarization layer OC2 may be provided or disposed on the second passivation layer PAS2 to planarize the top of the light emitting element layer EML. For example, the second planarization layer OC2 may include an organic material.

The wavelength conversion layer WLCL may include a first capping layer CAP1, a first light blocking member BK1, a first wavelength converting part WLC1, a second wavelength converting part WLC2, a light transmitting part LTU, a second capping layer CAP2, and a third planarization layer OC3.

The first capping layer CAP1 may be disposed on the second planarization layer OC2 of the light emitting element layer EML. The first capping layer CAP1 may seal lower surfaces of the first and second wavelength converting parts WLC1 and WLC2 and the light transmitting part LTU. For example, the first capping layer CAP1 may include an inorganic material.

The first light blocking member BK1 may be disposed on the first capping layer CAP1 in the light blocking area BA. The first light blocking member BK1 may overlap the second bank BNK2 in the thickness direction. The first light blocking member BK1 may block transmission of light. The first light blocking member BK1 may prevent color mixing by preventing intrusion of light between the first through third light emitting areas LA1 through LA3, thereby improving a color gamut of the display device 10. The first light blocking member BK1 may be disposed in a lattice shape surrounding the first through third light emitting areas LA1 through LA3 in a plan view.

The first light blocking member BK1 may include an organic light blocking material and a liquid repellent component. For example, the first light blocking member BK1 may be made of a black organic material including a liquid repellent component. The first light blocking member BK1 may be formed by coating and exposing an organic light blocking material including a liquid repellent component.

The first wavelength converting part WLC1 may be disposed on the first capping layer CAP1 in the first light emitting area LA1. The first wavelength converting part WLC1 may be surrounded by the first light blocking member BK1. The first wavelength converting part WLC1 may include a first base resin BS1, first scatterers SCT1, and first wavelength shifters WLS1.

The first base resin BS1 may include a material having a relatively high light transmittance. The first base resin BS1 may be made of a transparent organic material. For example, the first base resin BS1 may include at least one of organic materials such as epoxy resin, acrylic resin, cardo resin, and imide resin or a combination thereof.

The first scatterers SCT1 may have a refractive index different from that of the first base resin BS1 and may form an optical interface with the first base resin BS1. For example, the first scatterers SCT1 may include a light scattering material or light scattering particles that scatter at least a part of transmitted light. For example, the first scatterers SCT1 may include metal oxide such as titanium oxide (TiO$_2$), zirconium oxide (ZrO$_2$), aluminum oxide (Al$_2$O$_3$), indium oxide (In$_2$O$_3$), zinc oxide (ZnO) or tin oxide (SnO$_2$) or may include organic particles such as acrylic resin or urethane resin or a combination thereof. The first scatterers SCT1 may scatter incident light in random directions regardless of an incident direction of the incident light without substantially converting a peak wavelength of the incident light.

The first wavelength shifters WLS1 may convert or shift a peak wavelength of incident light into a first peak wavelength. For example, the first wavelength shifters WLS1 may convert blue light provided by the display device 10 into red light having a single peak wavelength in a range of about 610 nm to about 650 nm and emit the red light. The first wavelength shifters WLS1 may be quantum dots, quantum rods, or phosphors. The quantum dots may be particulate materials that emit light of a specific or predetermined color in a case that electrons transition from a conduction band to a valence band.

A part of blue light provided by the light emitting element layer EML may be transmitted through the first wavelength converting part WLC1 without being converted into red light by the first wavelength shifters WLS1. Of the blue light provided by the light emitting element layer EML, light incident on a first color filter CF1 without being converted by the first wavelength converting part WLC1 may be blocked by the first color filter CF1. Red light into which the blue light provided by the light emitting element layer EML has been converted by the first wavelength converting part WLC1 may be emitted to the outside through the first color filter CF1. Therefore, the first light emitting area LA1 may emit red light.

The second wavelength converting part WLC2 may be disposed on the first capping layer CAP1 in the second light emitting area LA2. The second wavelength converting part WLC2 may be surrounded by the first light blocking member BK1. The second wavelength converting part WLC2 may include a second base resin BS2, second scatterers SCT2, and second wavelength shifters WLS2.

The second base resin BS2 may include a material having a relatively high light transmittance. The second base resin BS2 may be made of a transparent organic material. For example, the second base resin BS2 may be made of the same or similar material as the first base resin BS1 or may be formed using the materials described in the description of the first base resin BS1.

The second scatterers SCT2 may have a refractive index different from that of the second base resin BS2 and may form an optical interface with the second base resin BS2. For example, the second scatterers SCT2 may include a light scattering material or light scattering particles that scatter at least a part of transmitted light. For example, the second scatterers SCT2 may be made of the same or similar material as the first scatterers SCT1 or may be formed using the materials described in the description of the first scatterers SCT1. The second scatterers SCT2 may scatter incident light in random directions regardless of an incident direction of the incident light without substantially converting a peak wavelength of the incident light.

The second wavelength shifters WLS2 may convert or shift a peak wavelength of incident light into a second peak wavelength different from the first peak wavelength of the first wavelength shifters WLS1. For example, the second wavelength shifters WLS2 may convert blue light provided by the display device 10 into green light having a single peak wavelength in a range of about 510 nm to about 550 nm and emit the green light. The second wavelength shifters WLS2 may be quantum dots, quantum rods, or phosphors. The second wavelength shifters WLS2 may include a material having the same purpose as the materials described in the description of the first wavelength shifters WLS1. The second wavelength shifters WLS2 may be made of quantum dots, quantum rods, or phosphors such that their wavelength conversion range may be different from the wavelength conversion range of the first wavelength shifters WLS1.

The light transmitting part LTU may be disposed on the first capping layer CAP1 in the third light emitting area LA3. The light transmitting part LTU may be surrounded by the first light blocking member BK1. The light transmitting part LTU may transmit incident light while maintaining a peak wavelength of the incident light. The light transmitting part LTU may include a third base resin BS3 and third scatterers SCT3.

The third base resin BS3 may include a material having a relatively high light transmittance. The third base resin BS3 may be made of a transparent organic material. For example, the third base resin BS3 may be made of the same or similar material as the first or second base resin BS1 or BS2 or may be formed using the materials described in the description of the first or second base resin BS1 or BS2.

The third scatterers SCT3 may have a refractive index different from that of the third base resin BS3 and may form an optical interface with the third base resin BS3. For example, the third scatterers SCT3 may include a light scattering material or light scattering particles that scatter at least a part of transmitted light. For example, the third scatterers SCT3 may be made of the same or similar material as the first or second scatterers SCT1 or SCT2 or may be formed using the materials described in the description of the first or second scatterers SCT1 or SCT2. The third scatterers SCT3 may scatter incident light in random directions regardless of an incident direction of the incident light without substantially converting a peak wavelength of the incident light.

Since the wavelength conversion layer WLCL may be disposed or may be directly disposed on the second planarization layer OC2 of the light emitting element layer EML, the display device 10 may not require a separate substrate or base part for the first and second wavelength converting parts WLC1 and WLC2 and the light transmitting part LTU. Therefore, the first and second wavelength converting parts WLC1 and WLC2 and the light transmitting part LTU can be easily aligned in the first through third light emitting areas LA1 through LA3, respectively, and the thickness of the display device 10 can be relatively reduced.

The second capping layer CAP2 may cover or overlap the first and second wavelength converting parts WLC1 and WLC2, the light transmitting part LTU, and the first light blocking member BK1. For example, the second capping layer CAP2 may prevent damage to or contamination of the first and second wavelength converting parts WLC1 and WLC2 and the light transmitting part LTU by sealing the first and second wavelength converting parts WLC1 and WLC2 and the light transmitting part LTU. For example, the second capping layer CAP2 may include an inorganic material.

The third planarization layer OC3 may be disposed on the second capping layer CAP2 to planarize the tops of the first and second wavelength converting parts WLC1 and WLC2 and the light transmitting part LTU. For example, the third planarization layer OC3 may include an organic material.

The color filter layer CFL may include a second light blocking member BK2, first through third color filters CF1 through CF3, and a third passivation layer PAS3.

The second light blocking member BK2 may be disposed on the third planarization layer OC3 in the light blocking area BA. The second light blocking member BK2 may overlap the first light blocking member BK1 or the second bank BNK2 in the thickness direction. The second light blocking member BK2 may block transmission of light. The second light blocking member BK2 may prevent color mixing by preventing intrusion of light between the first through third light emitting areas LA1 through LA3, thereby improving the color gamut of the display device 10. The second light blocking member BK2 may be disposed in a lattice shape surrounding the first through third light emitting areas LA1 through LA3 in a plan view.

The first color filter CF1 may be disposed on the third planarization layer OC3 in the first light emitting area LA1. The first color filter CF1 may be surrounded by the second light blocking member BK2. The first color filter CF1 may overlap the first wavelength converting part WLC1 in the thickness direction. The first color filter CF1 may selectively transmit light of the first color (for example, red light) and block or absorb light of the second color (for example, green light) and light of the third color (for example, blue light). For example, the first color filter CF1 may be a red color filter and may include a red colorant.

The second color filter CF2 may be disposed on the third planarization layer OC3 in the second light emitting area LA2. The second color filter CF2 may be surrounded by the second light blocking member BK2. The second color filter CF2 may overlap the second wavelength converting part WLC2 in the thickness direction. The second color filter CF2 may selectively transmit light of the second color (for example, green light) and block or absorb light of the first color (for example, red light) and light of the third color (for example, blue light). For example, the second color filter CF2 may be a green color filter and may include a green colorant.

The third color filter CF3 may be disposed on the third planarization layer OC3 in the third light emitting area LA3. The third color filter CF3 may be surrounded by the second light blocking member BK2. The third color filter CF3 may overlap the light transmitting part LTU in the thickness direction. The third color filter CF3 may selectively transmit light of the third color (for example, blue light) and block or absorb light of the first color (for example, red light) and light of the second color (for example, green light). For example, the third color filter CF3 may be a blue color filter and may include a blue colorant.

The first through third color filters CF1 through CF3 may absorb a part of light coming from the outside of the display device 10, thereby reducing reflected light due to the external light. Therefore, the first through third color filters CF1 through CF3 may prevent color distortion due to reflection of external light.

Since the first through third color filters CF1 through CF3 may be disposed or directly disposed on the third planarization layer OC3 of the wavelength conversion layer WLCL, the display device 10 may not require a separate substrate or base part for the first through third color filters CF1 through CF3. Therefore, the thickness of the display device 10 can be relatively reduced.

The third passivation layer PAS3 may cover or overlap the first through third color filters CF1 through CF3. The third passivation layer PAS3 may protect the first through third color filters CF1 through CF3.

The encapsulation layer TFE may be disposed on the third passivation layer PAS3 of the color filter layer CFL. The encapsulation layer TFE may cover or overlap upper and side surfaces of the display layer DPL. For example, the encapsulation layer TFE may include at least one inorganic layer to prevent penetration of oxygen or moisture. The encapsulation layer TFE may include at least one organic layer to protect the display device 10 from foreign substances such as dust.

Figure 3:
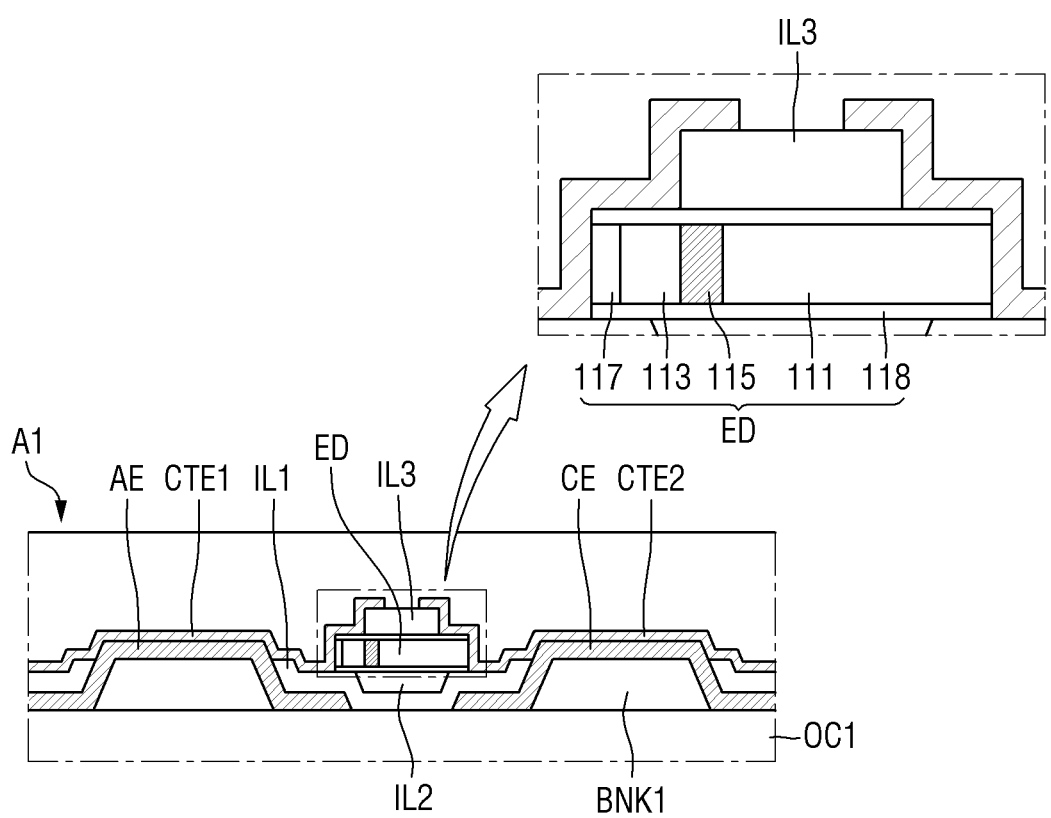
FIG. 3 is an enlarged view of area A1 of FIG. 2.

FIG. 3 is an enlarged view of area A1 of FIG. 2.

Referring to FIGS. 1, 2, and 3, the light emitting element layer EML of the display device 10 may be disposed on the thin-film transistor layer TFTL and may include first through third insulating layers IL1 through IL3.

A plurality of first banks BNK1 may be disposed in each of the first through third light emitting areas LA1 through LA3. Each of the first banks BNK1 may correspond to the first electrode AE or the second electrode CE. The first banks BNK1 may be disposed on the first planarization layer OC1, and side surfaces of each of the first banks BNK1 may be inclined from the first planarization layer OC1. The first and second electrodes AE and CE may be disposed on the corresponding first banks BNK1, respectively. The first banks BNK1 may include, but are not limited to, polyimide (PI).

The first and second electrodes AE and CE may include a transparent conductive material. For example, each of the first and second electrodes AE and CE may include, but is not limited to, at least one of indium tin oxide (ITO), indium zinc oxide (IZO), and indium tin zinc oxide (ITZO) or a combination thereof.

The first and second electrodes AE and CE may include a conductive material having a high reflectivity. For example, the first and second electrodes AE and CE may include a metal having high reflectivity, such as silver (Ag), copper (Cu) or aluminum (Al) or a combination thereof. The first and second electrodes AE and CE may reflect light incident from the light emitting diode ED to above the display device 10.

The first insulating layer IL1 may be disposed on the first planarization layer OC1, the first electrode AE, and the second electrode CE. The first insulating layer IL1 may cover or overlap a part of each of the first and second electrodes AE and CE. For example, the first insulating layer IL1 may include openings that expose parts of the first and second electrodes AE and CE which correspond to upper surfaces of the first banks BNK1. The first insulating layer IL1 may protect the first and second electrodes AE and CE and insulate the first and second electrodes AE and CE from each other. The first insulating layer IL1 may prevent the light emitting diode ED from contacting or directly contacting other members and thus being damaged.

For example, the first insulating layer IL1 may include an inorganic insulating material and include a step recessed between the first and second electrodes AE and CE. The second insulating layer IL2 may fill the recessed step of the first insulating layer ILL Therefore, the second insulating layer IL2 may planarize an upper surface of the first insulating layer ILL and the light emitting diode ED may be disposed on the first and second insulating layers IL1 and IL2.

The light emitting diode ED may be disposed on the first and second insulating layers IL1 and IL2 between the first electrode AE and the second electrode CE. An end of the light emitting diode ED may be electrically connected to the first electrode AE, and the other end of the light emitting diode ED may be electrically connected to the second electrode CE. For example, the light emitting diode ED may be electrically connected to the first electrode AE through a first contact electrode CTE1 and may be electrically connected to the second electrode CE through a second contact electrode CTE2.

The light emitting diode ED may be an inorganic light emitting diode having a size of micrometers or nanometers and including an inorganic material. The inorganic light emitting diode may be aligned between two electrodes facing each other according to an electric field formed in a direction between the two electrodes.

The light emitting diode ED may include a first semiconductor layer 111, a second semiconductor layer 113, an active layer 115, an electrode layer 117, and an insulating film 118.

The first semiconductor layer 111 may be an n-type semiconductor. For example, in a case that the light emitting diode ED emits blue light, the first semiconductor layer 111 may include a semiconductor material having a chemical formula of AlxGayIn1-x-yN ($0 \leq x \leq 1$, $0 \leq y \leq 1$, $0 \leq x+y \leq 1$). The first semiconductor layer 111 may include at least one semiconductor material selected from n-type doped AlGaInN, GaN, AlGaN, InGaN, AlN, and InN or a combination thereof. The first semiconductor layer 111 may be doped with an n-type dopant such as Si, Ge, or Sn. The first semiconductor layer 111 may be n-GaN doped with n-type Si.

The second semiconductor layer 113 may be disposed on the active layer 115. For example, in a case that the light emitting diode ED emits blue light or green light, the second semiconductor layer 113 may include a semiconductor material having a chemical formula of AlxGayIn1-x-yN ($0 \leq x \leq 1$, $0 \leq y \leq 1$, $0 \leq x+y \leq 1$). For example, the second semiconductor layer 113 may include at least one semiconductor material selected from p-type doped AlGaInN, GaN, AlGaN, InGaN, AlN, and LTA or a combination thereof. The second semiconductor layer 113 may be doped with a p-type dopant such as Mg, Zn, Ca, Se, or Ba. The second semiconductor layer 113 may be p-GaN doped with p-type Mg.

The active layer 115 may be disposed between the first and second semiconductor layers 111 and 113. The active layer 115 may include a material having a single or multiple quantum well structure. In a case that the active layer 115 may include a material having a multiple quantum well structure, it may have a structure in which a plurality of quantum layers and a plurality of well layers may be alternately stacked each other. The active layer 115 may emit light through combination of electron-hole pairs according to electrical signals received through the first and second semiconductor layers 111 and 113. For example, in a case that the active layer 115 emits blue light, it may include a material such as AlGaN or AlGaInN. In a case that the active layer 115 has a multiple quantum well structure in which a quantum layer and a well layer may be alternately stacked each other, the quantum layer may include a material such as AlGaN or AlGaInN, and the well layer may include a material such as GaN or AlInN. The active layer 115 may include AlGaInN as a quantum layer and AlInN as a well layer to emit blue light.

The electrode layer 117 may be an ohmic contact electrode. As in another example, the electrode layer 117 may be a Schottky contact electrode. The light emitting diode ED may include at least one electrode layer 117. In a case that the light emitting diode ED is electrically connected to the first or second contact electrode CTE1 or CTE2, the electrode layer 117 may reduce the resistance between the light emitting diode ED and the first or second contact electrode CTE1 or CTE2. The electrode layer 117 may include a conductive metal.

The insulating film 118 may surround outer surfaces of a plurality of semiconductor layers and a plurality of electrode layers. The insulating film 118 may surround an outer surface of the active layer 115 and extend in a direction in which the light emitting diode ED extends. The insulating film 118 may protect the light emitting diode ED. For example, the insulating film 118 may surround side surfaces of the light emitting diode ED and expose both ends of the light emitting diode ED in a longitudinal direction. The insulating film 118 may protect an outer surface of the light emitting diode ED including the active layer 115, thereby preventing a reduction in luminous efficiency.

The third insulating layer 113 may be disposed on a part of the light emitting diode ED disposed between the first and second electrodes AE and CE. The third insulating layer IL3 may partially cover or overlap the outer surface of the light emitting diode ED. The third insulating layer IL3 may protect the light emitting diode ED.

The first contact electrode CTE1 may cover or overlap the first electrode AE and a part of the light emitting diode ED and may electrically connect the first electrode AE and the light emitting diode ED. The second contact electrode CTE2 may cover or overlap the second electrode CE and another part of the light emitting diode ED and may electrically connect the second electrode CE and the light emitting diode ED, The first and second contact electrodes CTE1 and CTE2 may include a conductive material. For example, the first and second contact electrodes CTE1 and CTE2 may include, but are not limited to, ITO, IZO, ITZO, or aluminum (Al) or combinations thereof.

Figure 4:
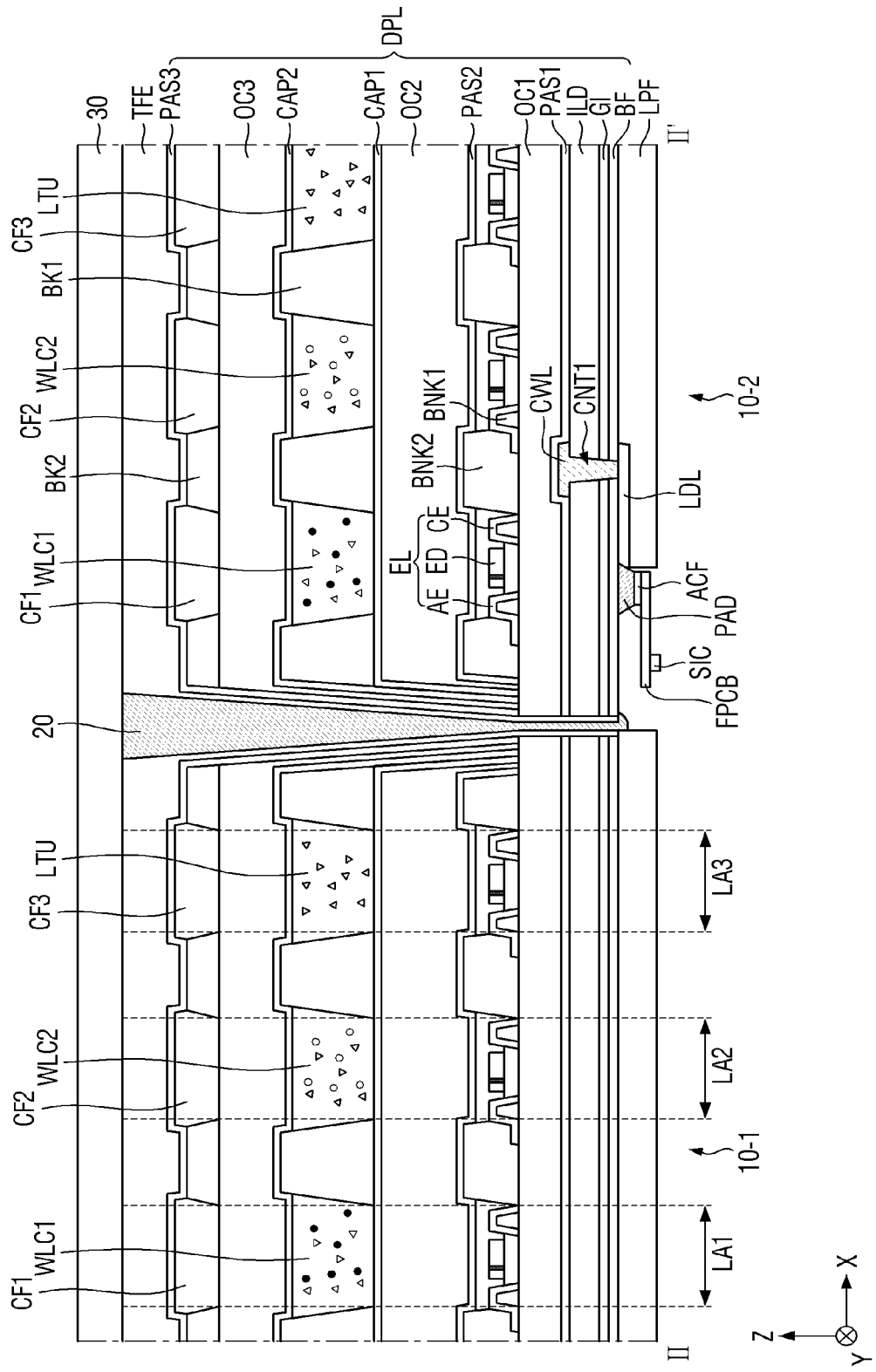
FIG. 4 is a schematic cross-sectional view taken along line II-II' of FIG. 1.

FIG. 4 is a schematic cross-sectional view taken along line II-II' of FIG. 1.

Referring to FIG. 4, the tiled display device TD may include a plurality of display devices 10, a coupling or connecting member 20, and a cover member 30.

Each of the display devices 10 may include the lower film LPF, a connection line CWL, the display layer DPL, the encapsulation layer TFE, a lead line LDL, a pad part PAD, a flexible film FPCB, and a source driver SIC.

The lower film LPF may support the display layer DPL and protect the lower surface of each display device 10. The lower film LPF may have flexible properties so as to be bendable, foldable or rollable, but the disclosure is not limited thereto.

The lower film LPF may cover or overlap the lead line LDL and a lower surface of the display layer DPL. For example, the lower film LPF may cover or overlap an area of the lower surface of the display layer DPL in which the pad part PAD may not be disposed. Therefore, the lower film LPF may protect the lead line LDL and the lower surface of each display device 10 and support each display device 10.

The tiled display device TD may not include a separate substrate made of polyimide (PI) and may support the display layer DPL and protect the lower surface of each display device 10 through the lower film LPF. The lower film LPF may include an organic material other than polyimide. In the tiled display device TD, a contact hole penetrating a polyimide substrate may not be formed in the process of manufacturing each display device 10, and a part of the polyimide substrate may not be etched. Therefore, since the tiled display device TD may not require all processes for precision processing of the polyimide substrate in the process of manufacturing each display device 10, the degree of freedom in processing the polyimide substrate can be increased.

The display layer DPL may be disposed on the lower film LPF. The display layer DPL may include the thin-film transistor layer TFTL, the light emitting element layer EML, the wavelength conversion layer WLCL, and the color filter layer CFL.

The thin-film transistor layer TFTL may be disposed on the lower film LPF. The thin-film transistor layer TFTL may include the buffer layer BF, the thin-film transistors TFT, the gate insulating layer GI, the interlayer insulating film ILD, the first connection electrodes CNE1, the second connection electrodes CNE2, the first passivation layer PAS1, and the first planarization layer OC1.

The buffer layer BF may be disposed on the lower film LPF. The buffer layer BF may include an inorganic material that can prevent penetration of air or moisture. For example, the buffer layer BF may include a plurality of inorganic layers alternately stacked each other.

The gate insulating layer GI may be disposed on the buffer layer BF and the semiconductor regions ACT, the source electrodes SE and the drain electrodes DE of the thin-film transistors TFT.

The interlayer insulating film ILD may be disposed on the gate insulating layer GI and the gate electrodes GE of the thin-film transistors TFT.

The interlayer insulating film ILD, the gate insulating layer GI, and the buffer layer BF may include a first contact hole CNT1 through which the connection line CWL may pass.

The thin-film transistor layer TFTL may further include the connection line CWL disposed on the interlayer insulating film ILD. The connection line CWL may be inserted into the first contact hole CNT1 and exposed on the lower surface of the display layer DPL. The connection line CWL may be exposed on a lower surface of the buffer layer BF. The connection line CWL may be electrically connected to the lead line LDL provided or disposed on the lower surface of the buffer layer BF and may be connected to the pad part PAD through the lead line LDL. The connection line CWL may supply an electrical signal received from the pad part PAD to the thin-film transistors TFT.

The connection line CWL may be electrically connected to data lines to supply data voltages. The connection line CWL may be electrically connected to the first connection electrodes CNE1 through the data lines and may be electrically connected to the source electrodes SE of the thin-film transistors TFT through the first connection electrodes CNE1. For example, the connection line CWL may be formed on the same layer and of the same or similar material as the first and second connection electrodes CNE1 and CNE2 of the thin-film transistor layer TFTL, but the disclosure is not limited thereto.

For another example, the connection line CWL may be formed on the same layer and of the same or similar material as the gate electrodes GE of the thin-film transistors TFT. The connection line CWL may be electrically connected to a plurality of scan lines to supply scan signals.

The lead line LDL may be disposed on the lower surface of the buffer layer BF and may electrically connect the connection line CWL and the pad part PAD. For example, the lead line LDL may be integral with the pad part PAD, but the disclosure is not limited thereto. The lead line LDL may cover or overlap the first contact hole CNT1 and may be electrically connected to the connection line CWL exposed by the first contact hole CNT1. The lead line LDL may have, but is not limited to, a substantially spider shape. For example, the lead line LDL may have, but is not limited to, a stacked structure (Al/Cu) of aluminum and copper or a stacked structure (Ti/Al/Ti) of aluminum and titanium.

The pad part PAD may be disposed on the lower surface of the buffer layer BF and may be electrically connected to the connection line CWL through the lead line LDL. The pad part PAD disposed on the lower surface of the buffer layer BF may be spaced apart from the connection line CWL in a plan view. The pad part PAD may receive various voltages or signals from the flexible film FPCB and supply the voltages or signals to the connection line CWL.

A connection film ACF may attach the flexible film FPCB to the pad part PAD. A surface of the connection film ACF may be attached to the pad part PAD, and the other surface of the connection film ACF may be attached to the flexible film FPCB. For example, the connection film ACF may cover or overlap the entire pad part PAD, but the disclosure is not limited thereto.

The connection film ACF may include an anisotropic conductive film. In a case that the connection film ACF may include an anisotropic conductive film, it may have conductivity in an area where the pad part PAD and a contact pad of the flexible film FPCB contact each other and may electrically connect the flexible film FPCB to the pad part PAD.

The flexible film FPCB may be disposed under or below the display layer DPL. A side of the flexible film FPCB may be electrically connected to the pad part PAD through the connection film ACF, and the other side of the flexible film FPCB may be electrically connected to a source circuit board (not illustrated) under or below the display layer DPL. The flexible film FPCB may transmit signals of the source driver SIC to the thin-film transistor layer TFTL. For example, the source driver SIC may be an integrated circuit. The source driver SIC may convert digital video data into analog data voltages based on a source control signal of a timing controller and supply the analog data voltages to the data lines of the display area DA through the flexible film FPCB.

The coupling member 20 may be disposed in the coupling area SM of the tiled display device TD. The tiled display device TD may be formed by coupling side surfaces of adjacent display devices 10 to each other using the coupling member 20 disposed between the display devices 10, The coupling member 20 may connect side surfaces of the first through fourth display devices 10-1 through 10-4 arranged or disposed in a lattice shape, thereby realizing the tiled display device TD. The coupling member 20 may couple side surfaces of the respective encapsulation layers TFE of adjacent display devices 10.

For example, the coupling member 20 may be made of an adhesive or double-sided tape having a relatively small thickness to minimize a gap between the display devices 10. For another example, the coupling member 20 may be made of a coupling frame having a relatively small thickness to minimize the gap between the display devices 10. Therefore, the tiled display device TD may prevent the coupling area SM between the display devices 10 from being recognized by a user.

The cover member 30 may be disposed on upper surfaces of the display devices 10 and the coupling member 20 to cover or overlap the display devices 10 and the coupling member 20. For example, the cover member 30 may be disposed on an upper surface of the encapsulation layer TFE of each of the display devices 10. The cover member 30 may protect an upper surface of the tiled display device TD.

FIGS. 5 through 10 are schematic cross-sectional views illustrating a process of manufacturing a display device 10 of FIG. 4.

Figure 5:
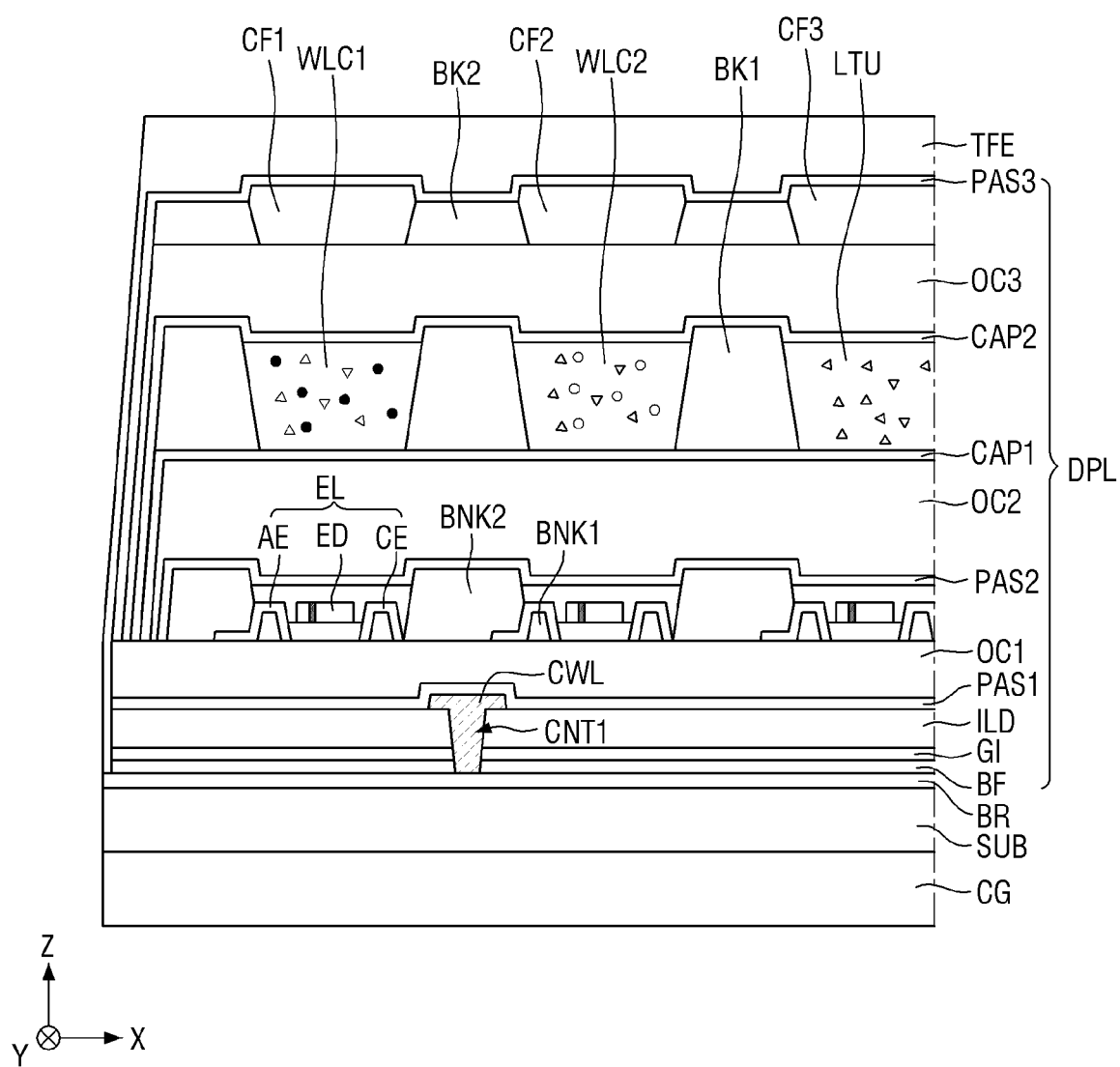
FIGS. 5 through 10 are schematic cross-sectional views illustrating a process of manufacturing a display device of FIG. 4.

In FIG. 5, a base part SUB may be provided or disposed on a carrier substrate CG. The base part SUB may include polyimide (PI). For example, the carrier substrate CG may be, but is not limited to, a carrier glass. The carrier substrate CG may support the base part SUB in the process of forming a display layer DPL and an encapsulation TFE on the base part SUB.

A barrier layer BR may be formed or disposed on the base part SUB. The barrier layer BR may include an inorganic material that can prevent penetration of air or moisture. For example, the barrier layer BR may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride or a combination thereof.

A buffer layer BF may be formed or disposed on the barrier layer BR. The buffer layer BF may include an inorganic material that can prevent penetration of air or moisture. For example, the buffer layer BF may include a plurality of inorganic layers alternately stacked each other.

A gate insulating layer GI may be formed or disposed on the buffer layer BF and semiconductor regions ACT, source electrodes SE and drain electrodes DE of thin-film transistors TFT.

An interlayer insulating film ILD may be formed or disposed on the gate insulating layer GI and gate electrodes GE of the thin-film transistors TFT.

The interlayer insulating film ILD, the gate insulating layer GI, and the buffer layer BF may include a first contact hole CNT1 through which a connection line CWL may pass.

The connection line CWL may be formed or disposed on the interlayer insulating film ILD and may be inserted into the first contact hole CNT1 and exposed on a lower surface of the display layer DPL. For example, the connection line CWL may be formed to fill the first contact hole CNT1 through an inkjet process, a cutting process, or a plating process.

A first passivation layer PAS1 may cover or overlap the interlayer insulating film ILD and the connection line CWL. A first planarization layer OC1 may be provided or disposed on the first passivation layer PAS1 to planarize the top of a thin-film transistor layer TFTL. A light emitting element layer EML, a wavelength conversion layer WLCL, a color filter layer CFL, and the encapsulation layer TFE may be sequentially stacked each other on the thin-film transistor layer TFTL.

Figure 6:
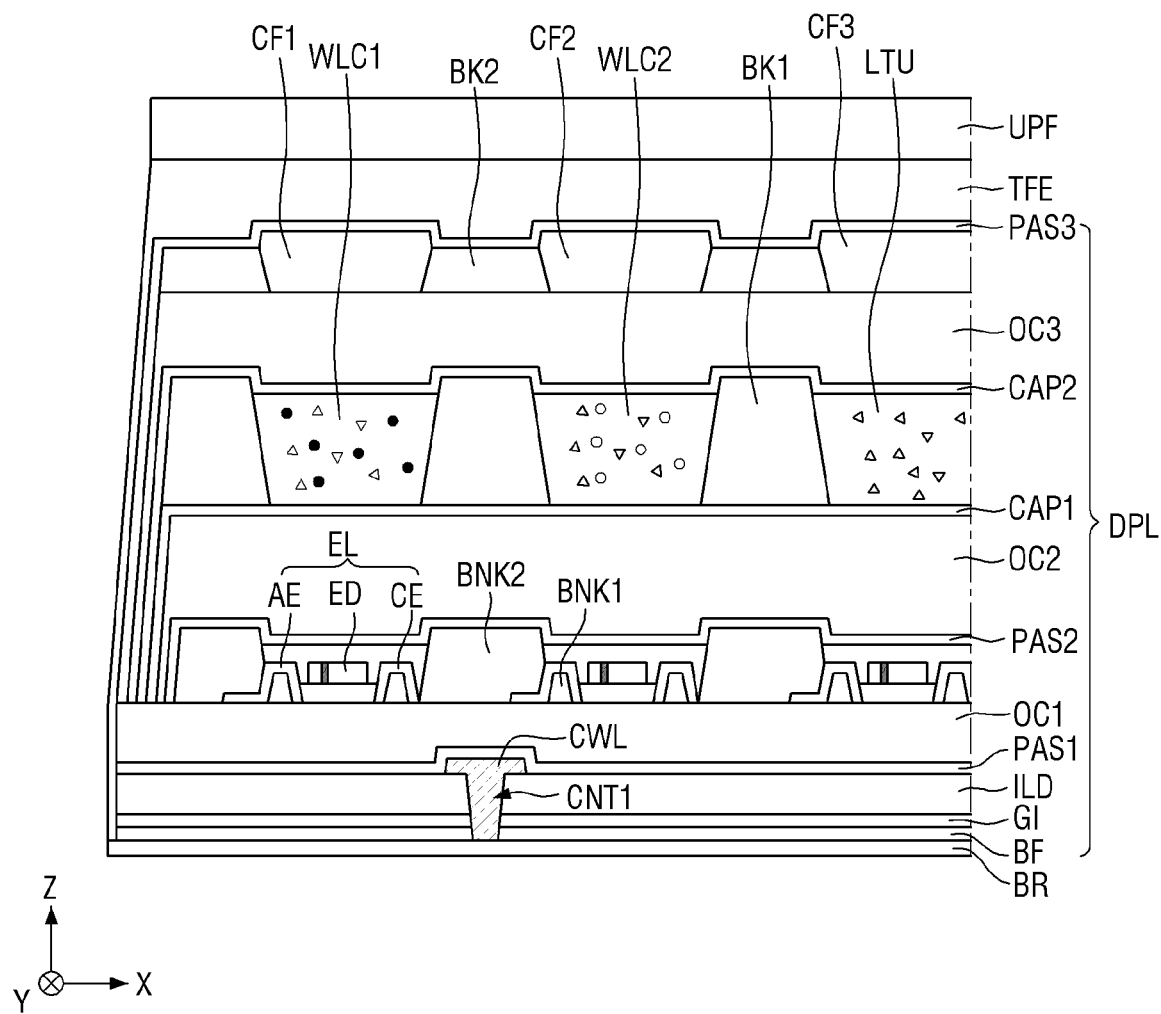

In FIG. 6, an upper film UPF may be formed or disposed on the encapsulation layer TFE. For example, the upper film UPF may be, but is not limited to, a carrier glass or a protective film. The upper film UPF may support the display device 10 in the process of removing the barrier layer BR from the lower surface of the display layer DPL and forming a lead line LDL, a pad part PAD and a lower film LPF. After the upper film UPF is disposed, the display device being manufactured may be inverted. Accordingly, the upper film UPF may support the display device, and the carrier substrate CG may be exposed. The carrier substrate CG and the base part SUB may be removed after the stacking of the display layer DPL and the encapsulation layer TFE is completed. For example, the base part SUB may be removed through at least one of a dry etching process, a wet etching process, a chemical mechanical polishing (CMP) process, and a laser etching process.

Figure 7:
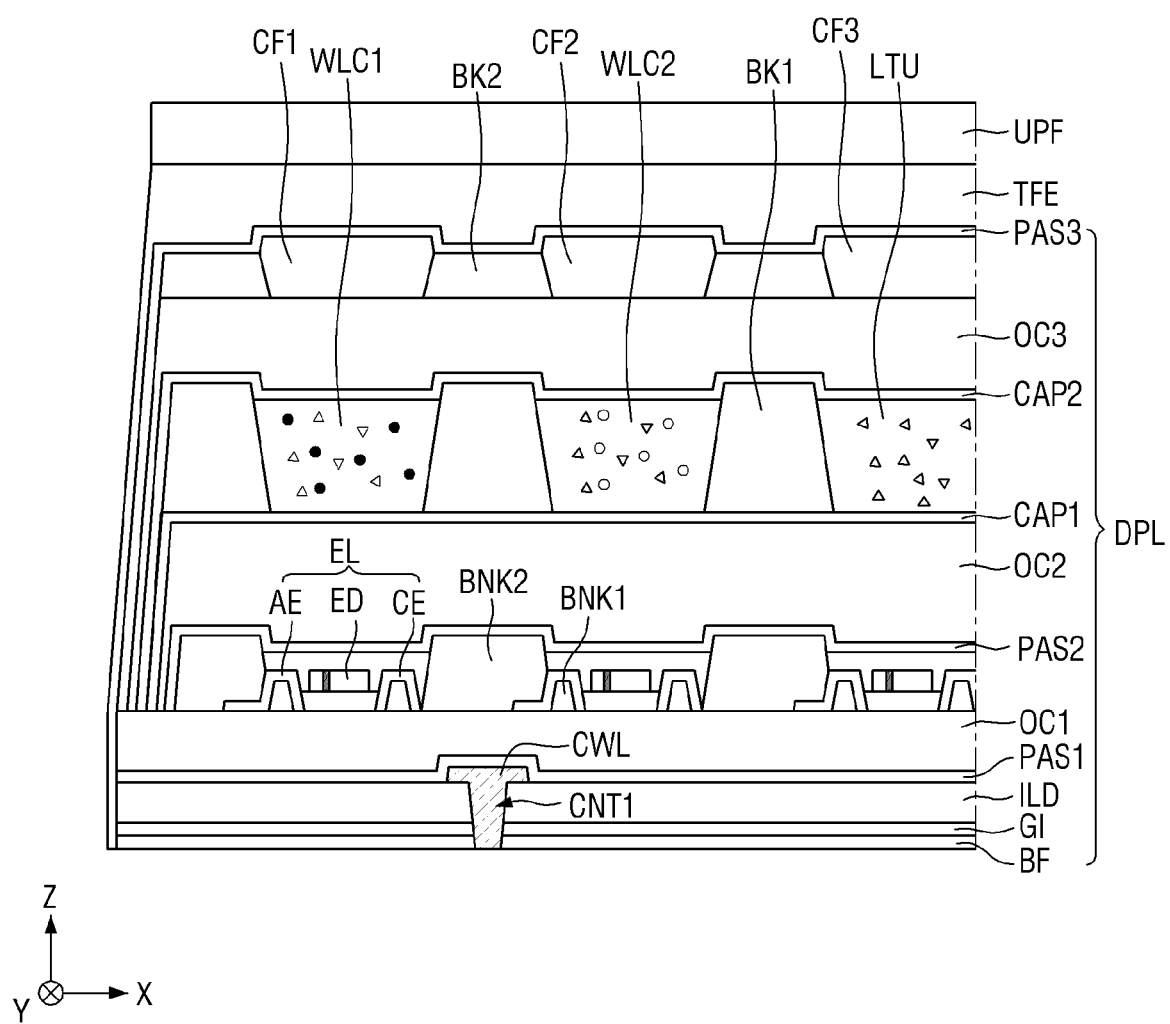

In FIG. 7, the barrier layer BR may be completely removed from the lower surface of the display layer DPL. For example, the barrier layer BR may be removed through at least one of a dry etching process, a wet etching process, and a CMP process. After the barrier layer BR is removed, the lower surface of the display layer DPL or a lower surface of the buffer layer BF may be exposed. The connection line CWL may be inserted into the first contact hole CNT1 and exposed on the lower surface of the display layer DPL.

Figure 8:
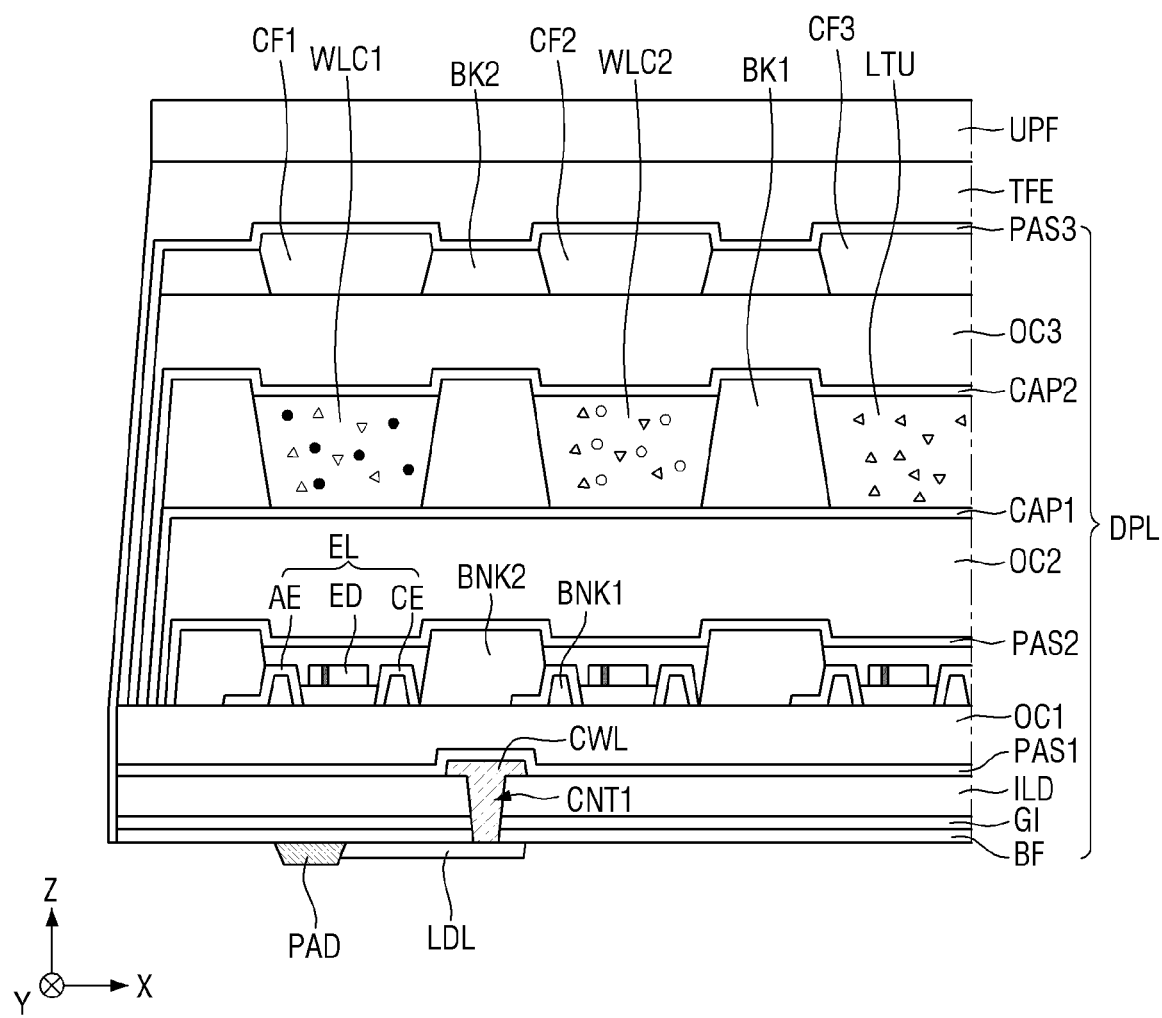

In FIG. 8, the lead line LDL and the pad part PAD may be formed or disposed on the lower surface of the buffer layer BF. The lead line LDL may cover or overlap the first contact hole CNT1 and may be electrically connected to the connection line CWL exposed by the first contact hole CNT1. The lead line LDL may electrically connect the connection line CWL and the pad part PAD. For example, the lead line LDL may be integral with the pad part PAD, but the disclosure is not limited thereto. The lead line LDL may have, but is not limited to, a substantially spider shape. For example, the lead line LDL may have, but is not limited to, a stacked structure (Al/Cu) of aluminum and copper or a stacked structure (Ti/Al/Ti) of aluminum and titanium.

The pad part PAD may be electrically connected to the connection line CWL through the lead line LDL. The pad part PAD may be disposed on the lower surface of the display layer DPL and spaced apart from the connection line CWL in a plan view.

Figure 9:
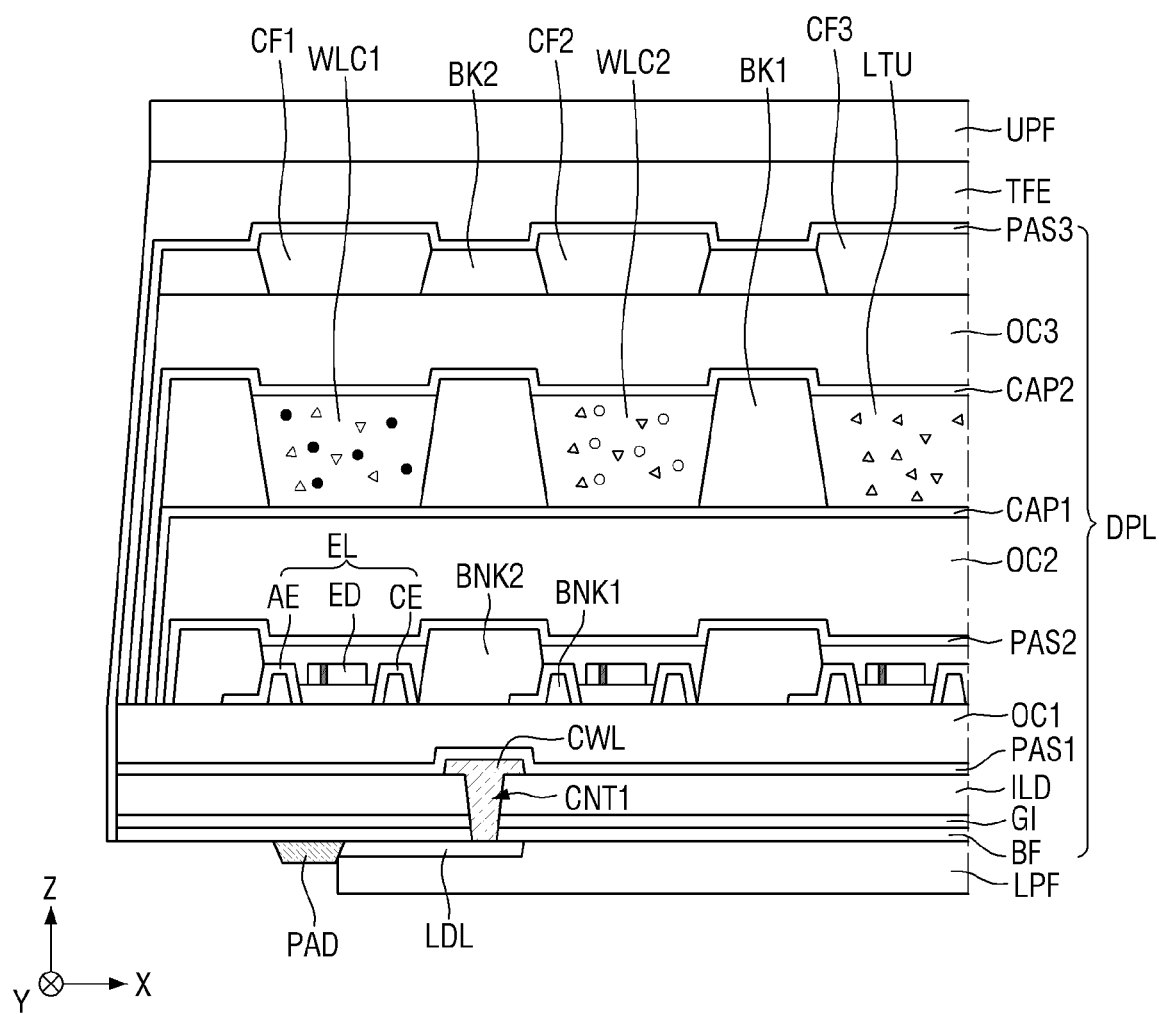

In FIG. 9, the lower film LPF may cover or overlap the lead line LDL and the lower surface of the display layer DPL. For example, the lower film LPF may cover or overlap an area of the lower surface of the display layer DPL in which the pad part PAD may not be disposed. Therefore, the lower film LPF may protect the lead line LDL and a lower surface of the display device 10 and support the display device 10.

For example, the lower film LPF may include at least one of acrylic resin, epoxy resin, phenolic resin, polyamides resin, unsaturated polyesters resin, polyphenylene ethers resin, polyphenylene sulfides resin, and benzocyclobutene resin or a combination thereof.

The lower film LPF may be formed through a printing process or a coating process using an organic material. For example, an organic material having fluidity may be provided or disposed on the lower surface of the display layer DPL through an inkjet printing process, a spin coating process, or a slit coating process. Here, the organic material having fluidity may have a low viscosity at which a considerable amount of the organic material may not be detached from the lower surface of the display layer DPL. The lower film LPF may be stably disposed on the lower surface of the display layer DPL through an ultraviolet curing or thermal curing process of the organic material having fluidity. A small amount of the lower film LPF which may be detached from the lower surface of the display layer DPL may be removed through a cutting process.

In the tiled display device TD, since the lower film LPF is formed through a printing process or a coating process using an organic material, the lower surface of the display device 10 can be planarized, and a defect rate of the lower film LPF can be reduced. For example, in the tiled display device TD, since the lower film LPF is formed using an organic material having fluidity, a step difference of the lower film LPF can be removed, and generation of bubbles or creation of an area to which the lower film LPF is not attached can be prevented compared with when the lower film LPF is formed using a lamination process.

The tiled display device TD may not include a separate substrate made of polyimide (PI) and may support the display layer DPL and protect the lower surface of the display device 10 through the lower film LPF. The lower film LPF may include an organic material other than polyimide. In the process of manufacturing the display device 10, the base part SUB made of polyimide (PI) may be completely removed, and a contact hole penetrating the base part SUB to electrically connect the connection line CWL and the pad part PAD may not be formed or disposed in the tiled display device TD. In the tiled display device TD, a part of the base part SUB may not be etched to electrically connect the connection line CWL and the pad part PAD. Therefore, since the tiled display device TD may not require all processes for precision processing of the base part SUB in the process of manufacturing the display device 10, the degree of freedom in processing the base part SUB can be increased.

Figure 10:
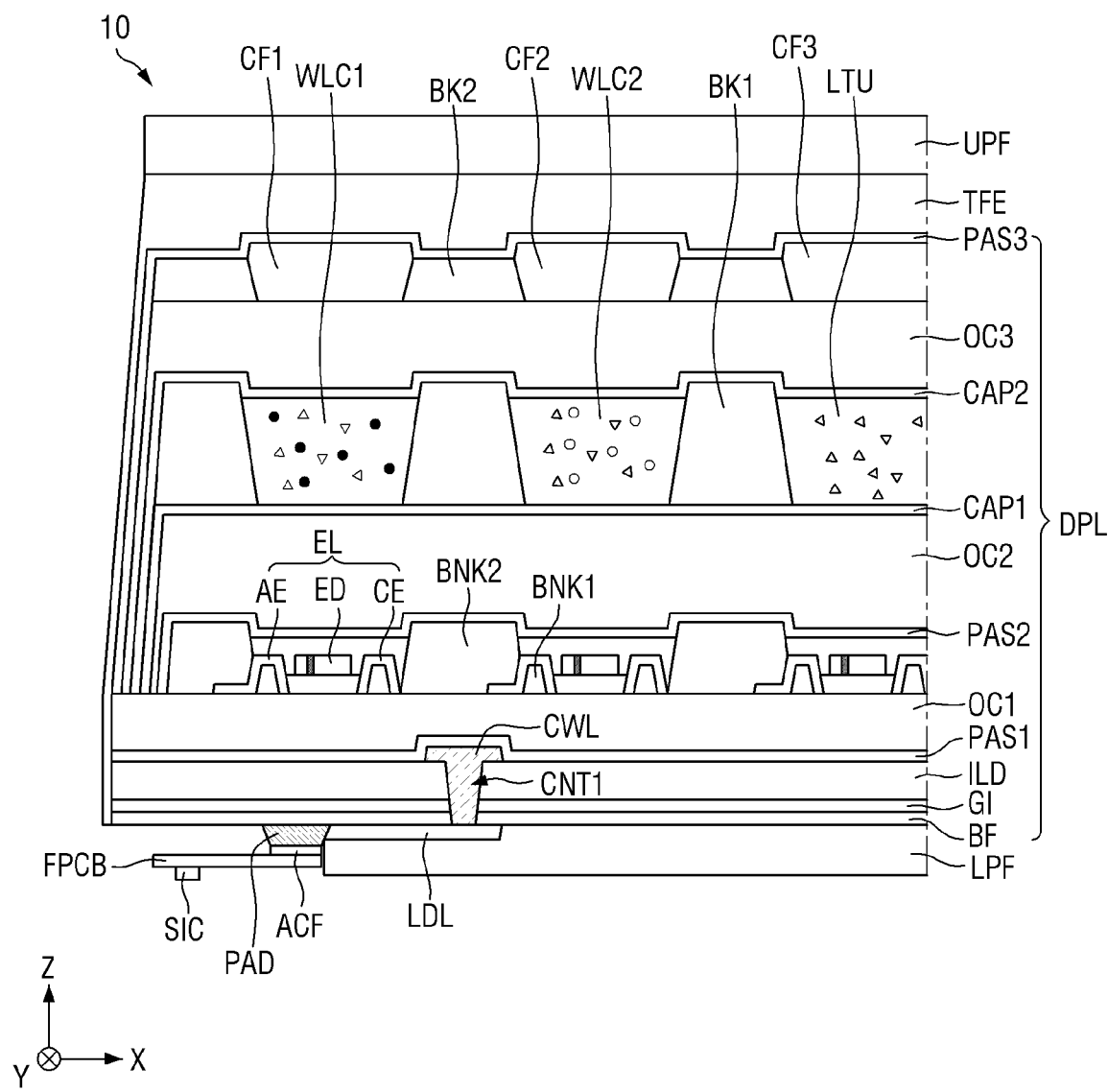

In FIG. 10, a flexible film FPCB may be disposed under or below the display layer DPL. A side of the flexible film FPCB may be electrically connected to the pad part PAD, and the other side of the flexible film FPCB may be electrically connected to a source circuit board (not illustrated) under or below the display layer DPL. The flexible film FPCB may transmit signals of a source driver SIC to the thin-film transistor layer TFTL. For example, the source driver SIC may be an integrated circuit. The source driver SIC may convert digital video data into analog data voltages based on a source control signal of a timing controller and supply the analog data voltages to data lines of a display area DA through the flexible film FPCB.

Figure 11:
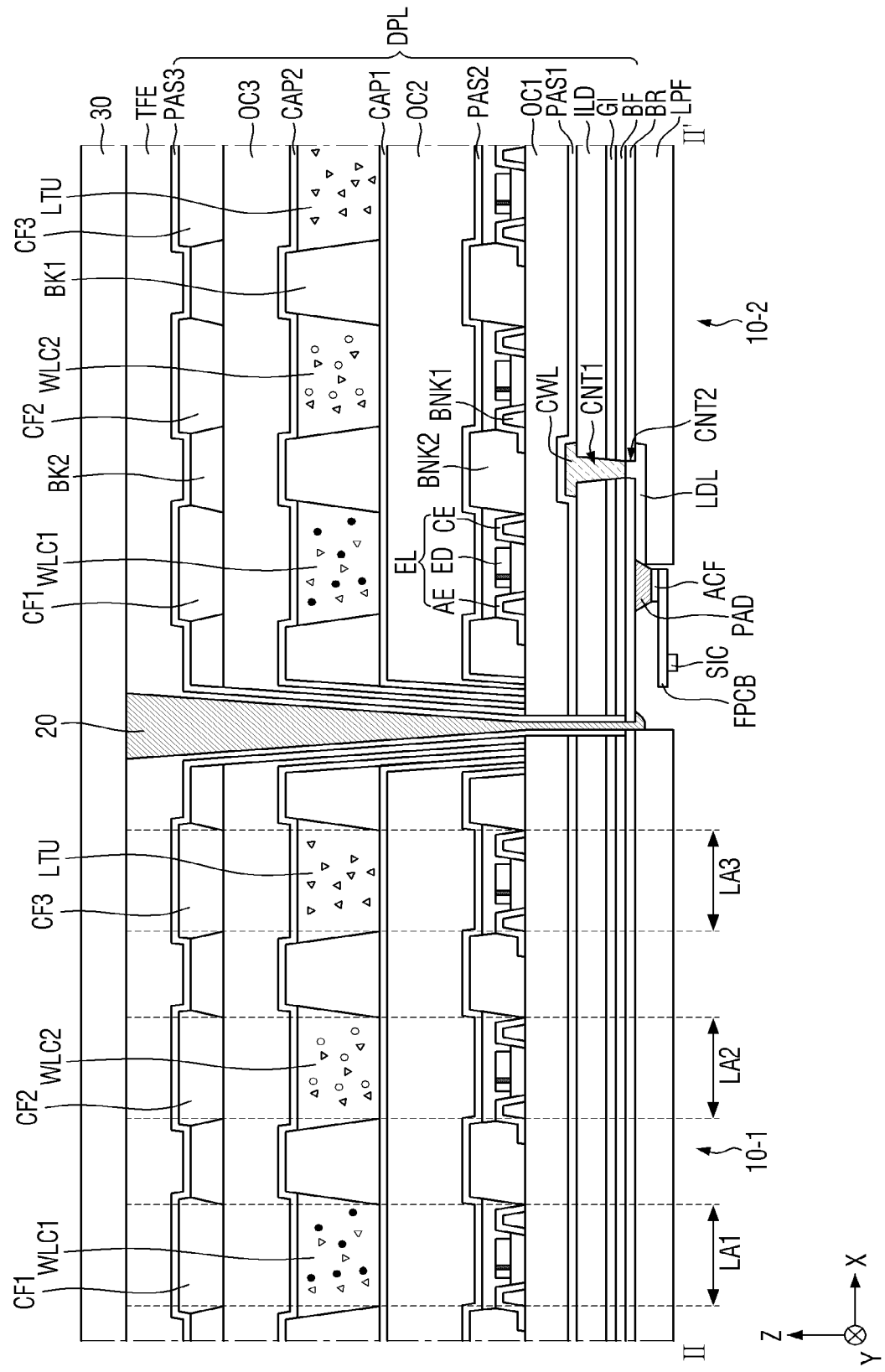
FIG. 11 is a schematic cross-sectional view taken along line II-II' of FIG. 1.

FIG. 11 is a schematic cross-sectional view taken along line II-II' of FIG. 1. A tiled display device TD of FIG. 11 may be different from the tiled display device TD of FIG. 4 in that it may further include a barrier layer BR. Thus, a description of the same elements as those described above will be given briefly or omitted.

Referring to FIG. 11, the tiled display device TD may include a plurality of display devices 10, a coupling member 20, and a cover member 30.

Each of the display devices 10 may include a lower film LPF, the barrier layer BR, a connection line CWL, a display layer DPL, an encapsulation layer TFE, a lead line LDL, a pad part PAD, a flexible film FPCB, and a source driver SIC.

The lower film LPF may support the display layer DPL and protect a lower surface of each display device 10. The lower film LPF may cover or overlap the lead line LDL and a lower surface of the barrier layer BR. For example, the lower film LPF may cover or overlap an area of the lower surface of the barrier layer BR in which the pad part PAD is not disposed. Therefore, the lower film LPF may protect the lead line LDL and the lower surface of each display device 10 and support each display device 10.

The tiled display device TD may not include a separate substrate made of polyimide (PI) and may support the display layer DPL and protect the lower surface of each display device 10 through the lower film LPF. The lower film LPF may include an organic material other than polyimide. In the tiled display device TD, a contact hole penetrating a polyimide substrate may not be formed in the process of manufacturing each display device 10, and a part of the polyimide substrate may not be etched. Therefore, since the tiled display device TD may not require all processes for precision processing of the polyimide substrate in the process of manufacturing each display device 10, the degree of freedom in processing the polyimide substrate can be increased.

The barrier layer BR may be disposed on the lower film LPF. The barrier layer BR may be disposed between the lower film LPF and the display layer DPL to protect the bottom of the display layer DPL. The barrier layer BR may include a second contact hole CNT2 through which the lead line LDL may pass. The second contact hole CNT2 may be connected to a first contact hole CNT1. The barrier layer BR may include an inorganic material that can prevent penetration of air or moisture. For example, the barrier layer BR may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride or a combination thereof.

The display layer DPL may be disposed on the barrier layer BR. The display layer DPL may include a thin-film transistor layer TFTL, a light emitting element layer EML, a wavelength conversion layer WLCL, and a color filter layer CFL.

The thin-film transistor layer TFTL may be disposed on the barrier layer BR. The thin-film transistor layer TFTL may include a buffer layer BF, thin-film transistors TFT, a gate insulating layer GI, an interlayer insulating film ILD, first connection electrodes CNE1, second connection electrodes CNE2, a first passivation layer PAS1, and a first planarization layer OC1.

The buffer layer BF may be disposed on the barrier layer BR. The buffer layer BF may include an inorganic material that can prevent penetration of air or moisture. For example, the buffer layer BF may include a plurality of inorganic layers alternately stacked each other.

The gate insulating layer GI may be disposed on the buffer layer BF and semiconductor regions ACT, source electrodes SE and drain electrodes DE of the thin-film transistors TFT.

The interlayer insulating film ILD may be disposed on the gate insulating layer GI and gate electrodes GE of the thin-film transistors TFT.

The interlayer insulating film ILD, the gate insulating layer GI, and the buffer layer BF may include the first contact hole CNT1 through which the connection line CWL may pass.

The thin-film transistor layer TFTL may further include the connection line CWL disposed on the interlayer insulating film ILD. The connection line CWL may be inserted into the first contact hole CNT1 and exposed on a lower surface of the display layer DPL. The connection line CWL may be exposed on a lower surface of the buffer layer BF. The connection line CWL may be electrically connected to the lead line LDL provided or disposed on the lower surface of the barrier layer BR and may be electrically connected to the pad part PAD through the lead line LDL. The connection line CWL may supply an electrical signal received from the pad part PAD to the thin-film transistors TFT.

The lead line LDL may be disposed on the lower surface of the barrier layer BR and inserted into the second contact hole CNT2 of the barrier layer BR. The lead line LDL inserted into the second contact hole CNT2 may be electrically connected to the connection line CWL. The lead line LDL may electrically connect the connection line CWL and the pad part PAD. For example, the lead line LDL may be integral with the pad part PAD, but the disclosure is not limited thereto. The lead line LDL may have, but is not limited to, a substantially spider shape.

The pad part PAD may be disposed on the lower surface of the barrier layer BR and may be electrically connected to the connection line CWL through the lead line LDL. The pad part PAD disposed on the lower surface of the barrier layer BR may be spaced apart from the second contact hole CNT2 in a plan view. The pad part PAD may receive various voltages or signals from the flexible film FPCB and supply the voltages or signals to the connection line CWL.

The flexible film FPCB may be disposed under or below the barrier layer BR. A side of the flexible film FPCB may be electrically connected to the pad part PAD through a connection film ACF, and the other side of the flexible film FPCB may be electrically connected to a source circuit board (not illustrated) under or below the barrier layer BR. The flexible film FPCB may transmit signals of the source driver SIC to the thin-film transistor layer TFTL.

FIGS. 12 through 15 are schematic cross-sectional views illustrating a process of manufacturing a display device 10 of FIG. 11. The display device manufacturing process of FIG. 12 may be a process following the display device manufacturing process of FIG. 6.

Figure 12:
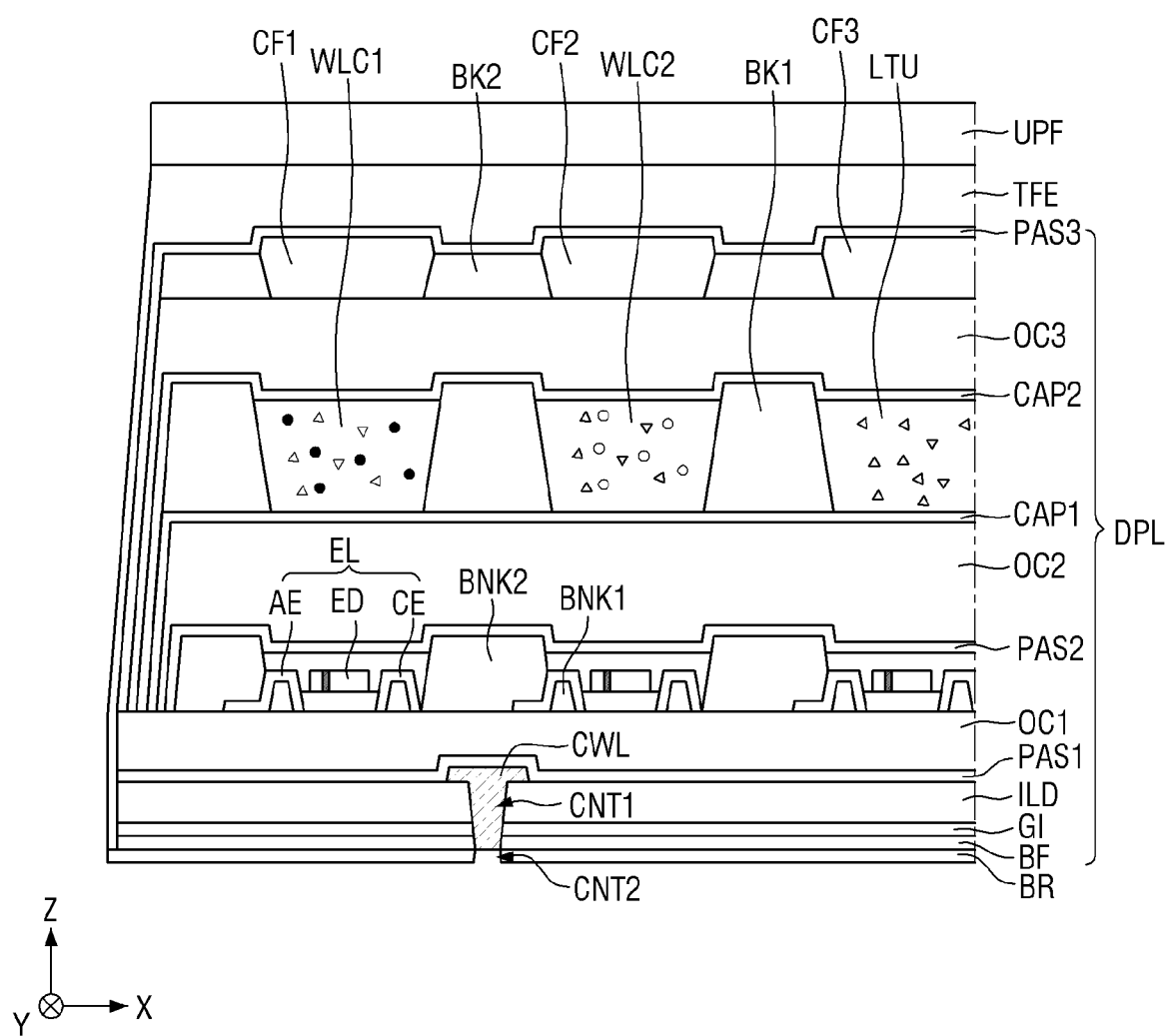
FIGS. 12 through 15 are schematic cross-sectional views illustrating a process of manufacturing a display device of FIG. 11.

In FIG. 12, a barrier layer BR may include a second contact hole CNT2 connected to a first contact hole CNT1. The second contact hole CNT2 may penetrate the barrier layer BR to expose a connection line CWL inserted into the first contact hole CNT1.

Figure 13:
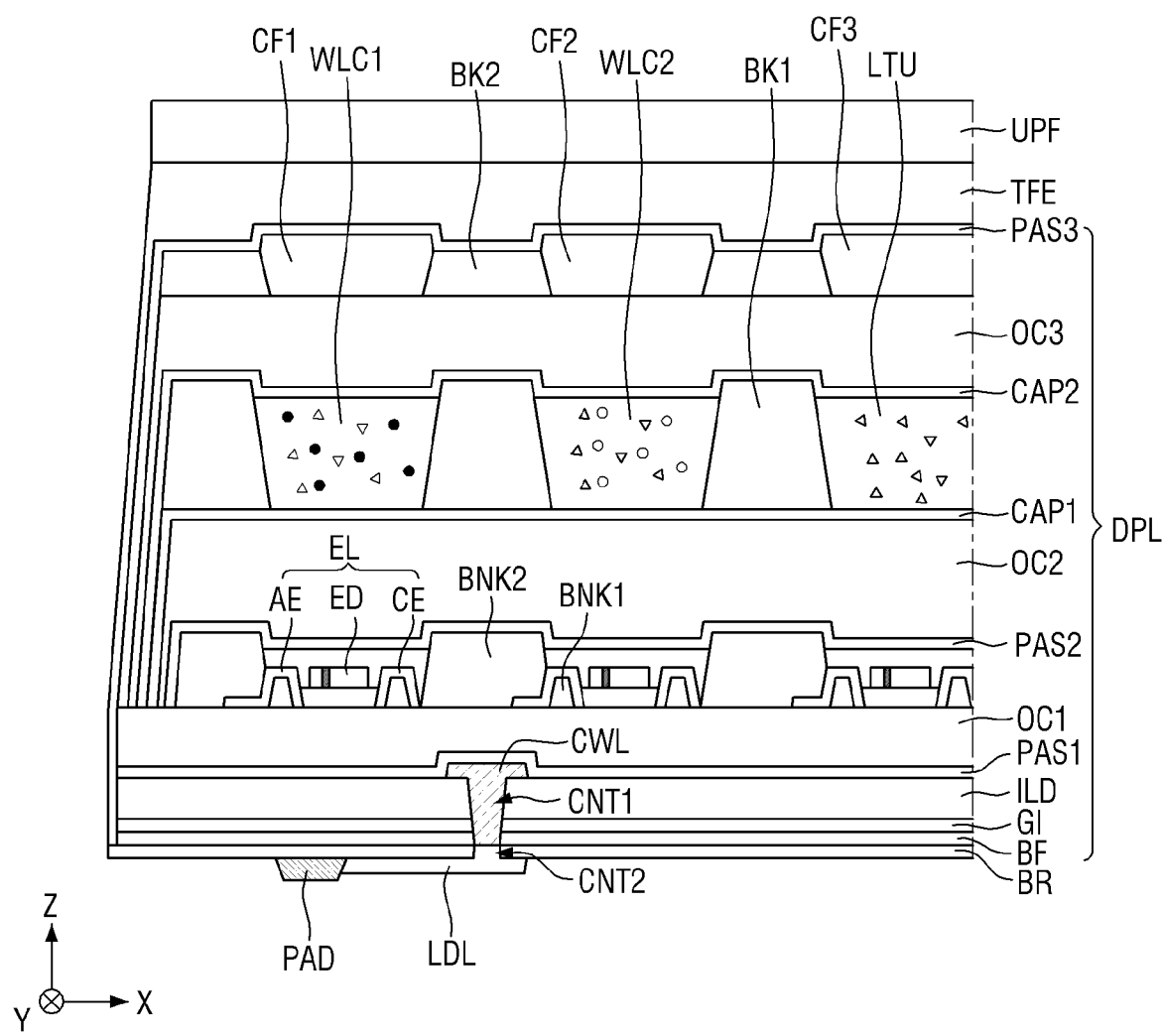

In FIG. 13, a lead line LDL and a pad part PAD may be formed or disposed on a lower surface of the barrier layer BR. The lead line LDL may be inserted into the second contact hole CNT2 and may be electrically connected to the connection line CWL exposed by the first contact hole CNT1. The lead line LDL may electrically connect the connection line CWL and the pad part PAD. For example, the lead line LDL may be integral with the pad part PAD, but the disclosure is not limited thereto. The lead line LDL may have, but is not limited to, a substantially spider shape.

The pad part PAD may be electrically connected to the connection line CWL through the lead line LDL. The pad part PAD disposed on the lower surface of the barrier layer BR may be spaced apart from the second contact hole CNT2 in a plan view.

Figure 14:
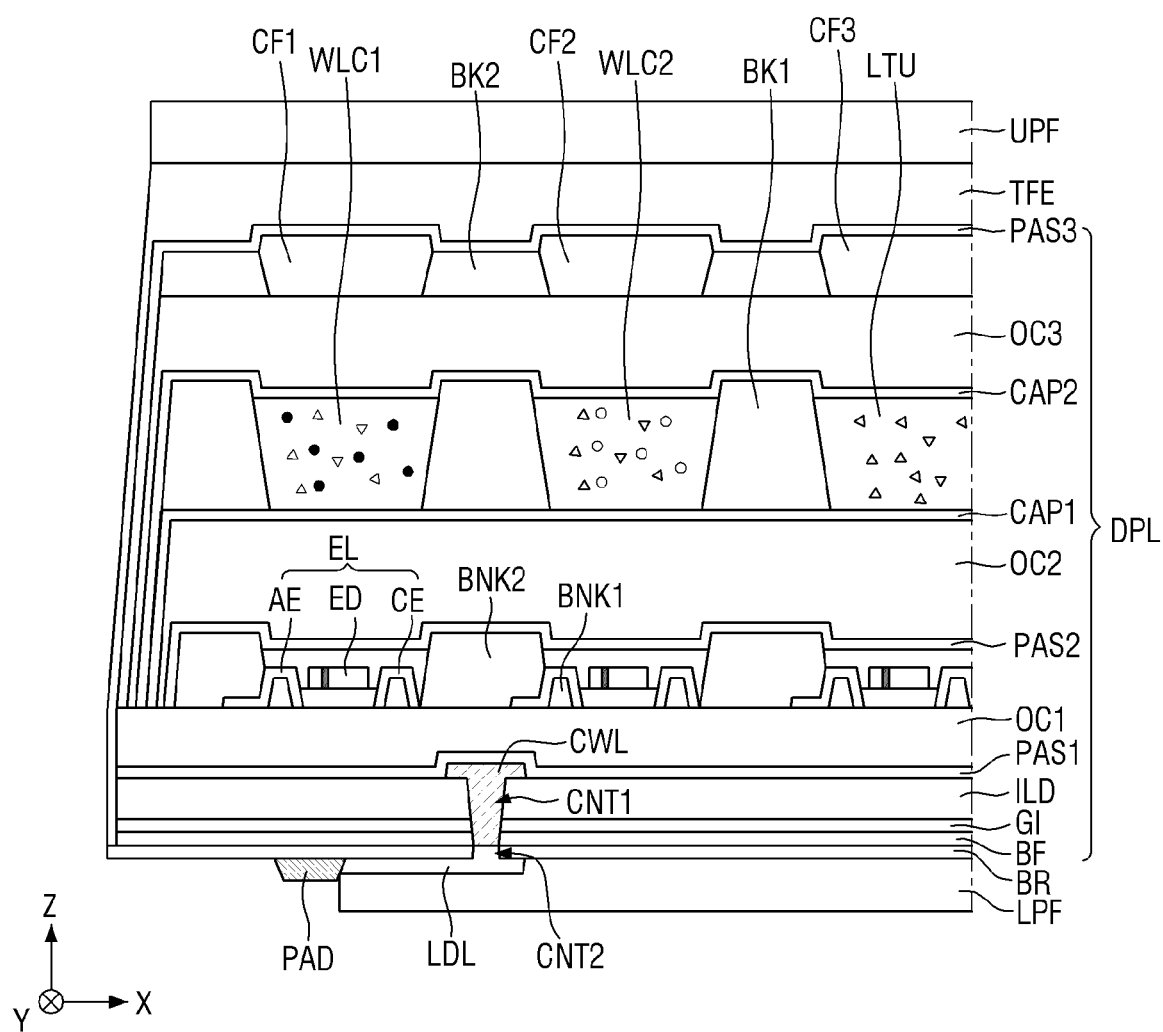

In FIG. 14, a lower film LPF may cover or overlap the lead line LDL and the lower surface of the barrier layer BR. For example, the lower film LPF may cover or overlap an area of the lower surface of the barrier layer BR in which the pad part PAD is not disposed. Therefore, the lower film LPF may protect the lead line LDL and a lower surface of the display device 10 and support the display device 10.

The tiled display device TD may not include a separate substrate made of polyimide (PI) and may support a display layer DPL and protect the lower surface of the display device 10 through the lower film LPF. The lower film LPF may include an organic material other than polyimide. In the process of manufacturing the display device 10, a base part SUB made of polyimide (PI) may be completely removed, and a contact hole penetrating the base part SUB to electrically connect the connection line CWL and the pad part PAD may not be formed or disposed in the tiled display device TD. In the tiled display device TD, a part of the base part SUB may not be etched to electrically connect the connection line CWL and the pad part PAD. Therefore, since the tiled display device TD may not require all processes for precision processing of the base part SUB in the process of manufacturing the display device 10, the degree of freedom in processing the base part SUB can be increased.

Figure 15:
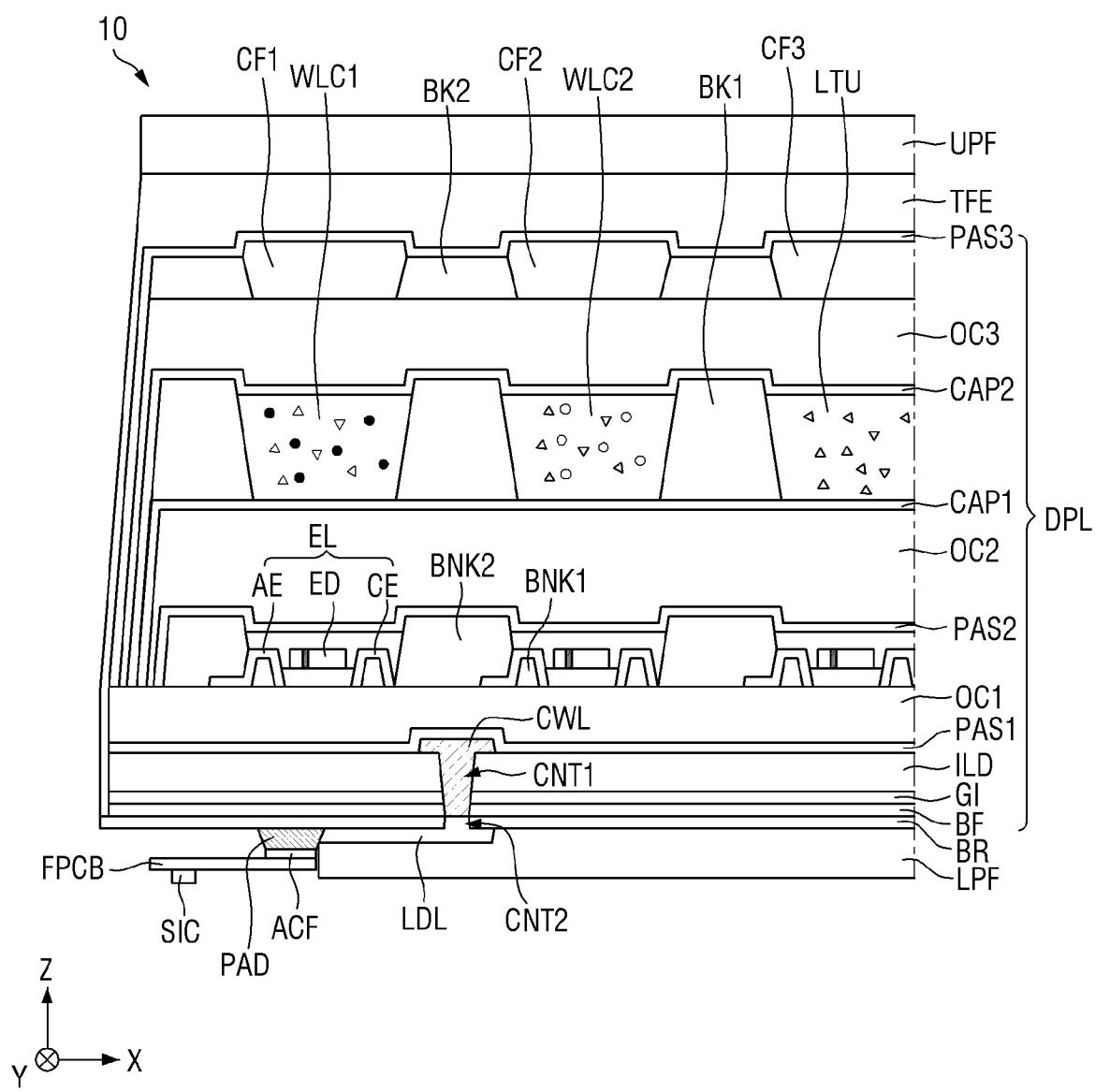

In FIG. 15, a flexible film FPCB may be disposed under or below the barrier layer BR. A side of the flexible film FPCB may be electrically connected to the pad part PAD through a connection film ACF, and the other side of the flexible film FPCB may be electrically connected to a source circuit board (not illustrated) under or below the barrier layer BR. The flexible film FPCB may transmit signals of a source driver SIC to a thin-film transistor layer TFTL.

Figure 16:
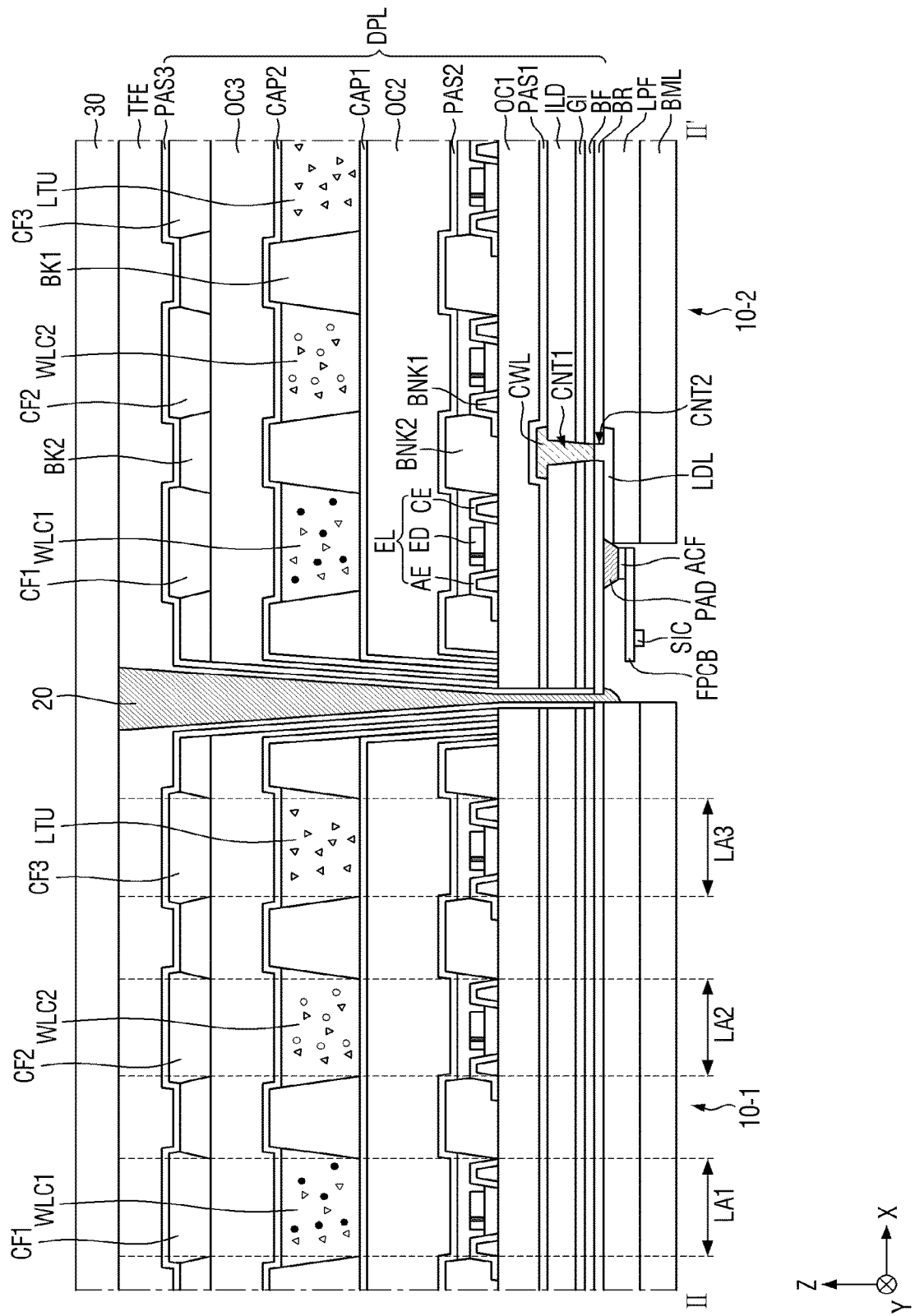
FIG. 16 is a schematic cross-sectional view taken along line II-II' of FIG. 1.
Figure 17:
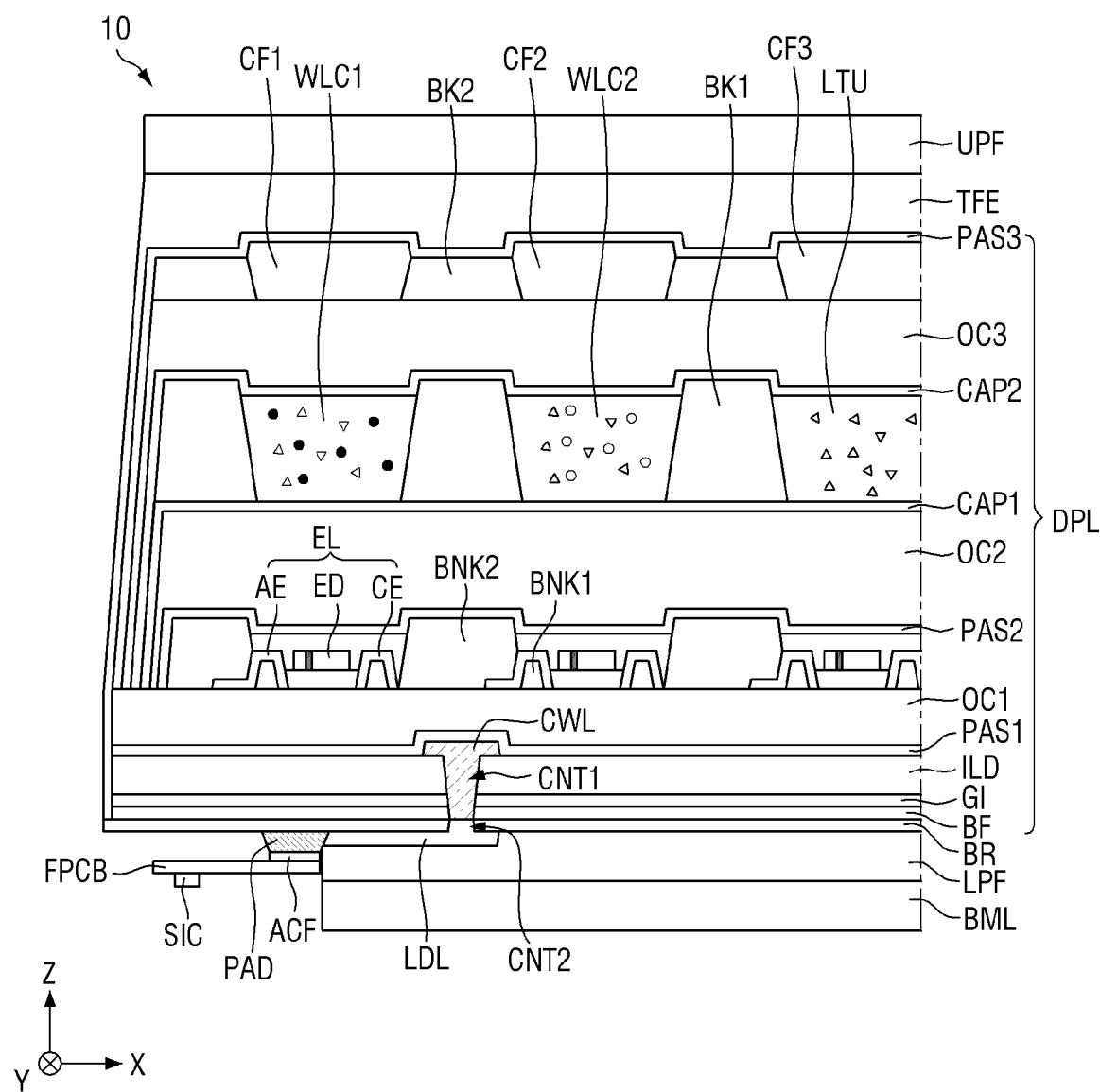
FIG. 17 is a schematic cross-sectional view of a display device of FIG. 16.

FIG. 16 is a schematic cross-sectional view taken along line II-II' of FIG. 1. FIG. 17 is a schematic cross-sectional view of a display device 10 of FIG. 16. A tiled display device TD of FIG. 16 may be different from a tiled display device TD of FIG. 11 in that it may further include a light blocking film BML. Thus, a description of the same elements as those described above will be given briefly or omitted.

Referring to FIGS. 16 and 17, each of a plurality of display devices 10 may further include the light blocking film BML which covers or overlaps a lower surface of a lower film LPF. The light blocking film BML may include a light blocking material and reduce external light reflectance of each display device 10. The light blocking film BML may be formed after the lower film LPF is formed or disposed on a lower surface of a barrier layer BR. The light blocking film BML may be formed before a flexible film FPCB is provided or disposed on a pad part PAD, but the disclosure is not limited thereto.

For example, external light reflectance of a display area DA of each of the display devices 10 and external light reflectance of a coupling area SM between the display devices 10 may be substantially equal. Therefore, the tiled display device TD may eliminate a sense of separation between the display devices 10 and improve the degree of immersion in images by preventing the coupling area SM between the display devices 10 from being recognized by a user.

Figure 18:
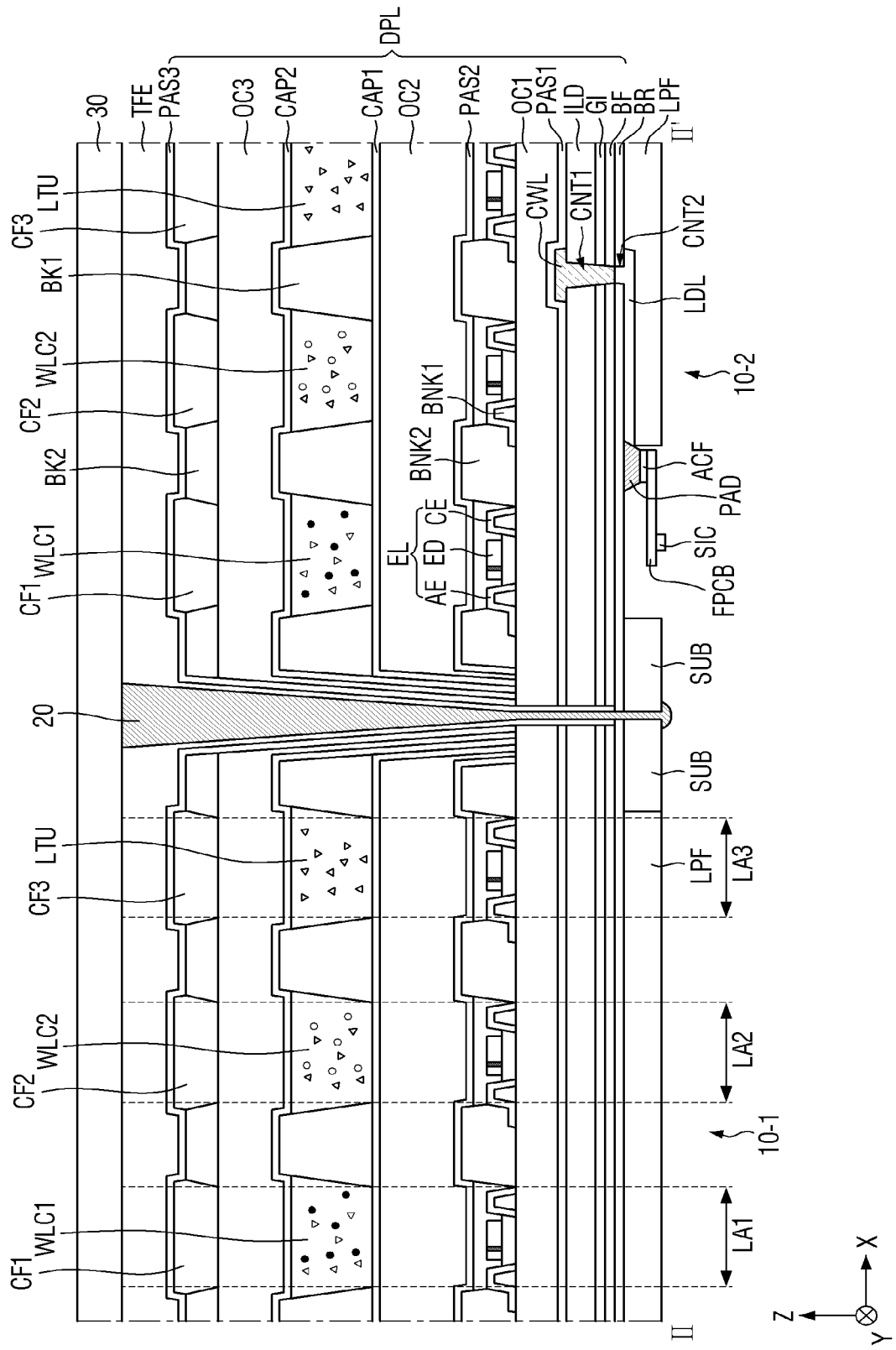
FIG. 18 is a schematic cross-sectional view taken along line II-II' of FIG. 1.

FIG. 18 is a schematic cross-sectional view taken along line II-II' of FIG. 1. A tiled display device TD of FIG. 18 may be different from the tiled display device TD of FIG. 11 in that it may further include a base part SUB. Thus, a description of the same elements as those described above will be given briefly or omitted.

Referring to FIG. 18, the tiled display device TD may include a plurality of display devices 10, a coupling member 20, and a cover member 30.

Each of the display devices 10 may include a lower film LPF, the base part SUB, a barrier layer BR, a connection line CWL, a display layer DPL, an encapsulation layer TFE, a lead line LDL, a pad part PAD, a flexible film FPCB, and a source driver SIC.

The lower film LPF may support the display layer DPL and protect a lower surface of each display device 10. The lower film LPF may cover or overlap the lead line LDL and a lower surface of the barrier layer BR. For example, the lower film LPF may cover or overlap an area of the lower surface of the barrier layer BR in which the pad part PAD is not disposed. Therefore, the lower film LPF may protect the lead line LDL and the lower surface of each display device 10 and support each display device 10.

The base part SUB may be disposed on edges of the lower surface of the barrier layer BR. The base part SUB may surround the lower film LPF. For example, the base part SUB may surround or may directly surround a side surface of a part of the lower film LPF and may surround a side surface of another part of the lower film LPF at a distance. The base part SUB may include polyimide (PI).

The tiled display device TD may support the display layer DPL and protect the lower surface of each display device 10 through the lower film LPF and may surround the lower film LPF using the base part SUB. The lower film LPF may include an organic material other than polyimide, and the base part SUB may include polyimide (PI). The base part SUB may support edges of each display device 10 and prevent the lower film LPF from being moved out of each display device 10 in the process of forming the lower film LPF. In the tiled display device TD, a contact hole penetrating the base part SUB may not be formed in the process of manufacturing each display device 10. Therefore, since the tiled display device TD may not require precision processing for forming a contact hole in the base part SUB, the degree of freedom in processing the base part SUB can be increased.

The barrier layer BR may be disposed on the lower film LPF. A considerable part of the barrier layer BR may be supported by the lower film LPF, and edges of the barrier layer BR may be supported by the base part SUB. The barrier layer BR may be disposed between the lower film LPF and the display layer DPL to protect the bottom of the display layer DPL. The barrier layer BR may include a second contact hole CNT2 through which the lead line LDL may pass. The second contact hole CNT2 may be connected to a first contact hole CNT1. The barrier layer BR may include an inorganic material that can prevent penetration of air or moisture.

The display layer DPL may be disposed on the barrier layer BR. The display layer DPL may include a thin-film transistor layer TFTL, a light emitting element layer EML, a wavelength conversion layer WLCL, and a color filter layer CFL.

The thin-film transistor layer TFTL may be disposed on the barrier layer BR. The thin-film transistor layer TFTL may include a buffer layer BF, thin-film transistors TFT, a gate insulating layer GI, an interlayer insulating film ILD, first connection electrodes CNE1, second connection electrodes CNE2, the connection line CWL, a first passivation layer PAS1, and a first planarization layer OC1.

The connection line CWL may be inserted into the first contact hole CNT1 and exposed on a lower surface of the display layer DPL. The connection line CWL may be exposed on a lower surface of the buffer layer BF. The connection line CWL may be electrically connected to the lead line LDL provided or disposed on the lower surface of the barrier layer BR and may be electrically connected to the pad part PAD through the lead line LDL. The connection line CWL may supply an electrical signal received from the pad part PAD to the thin-film transistors TFT.

The lead line LDL may be disposed on the lower surface of the barrier layer BR and inserted into the second contact hole CNT2 of the barrier layer BR. The lead line LDL inserted into the second contact hole CNT2 may be electrically connected to the connection line CWL. The lead line LDL may electrically connect the connection line CWL and the pad part PAD. For example, the lead line LDL may be integral with the pad part PAD, but the disclosure is not limited thereto. The lead line LDL may have, but is not limited to, a substantially spider shape.

The pad part PAD may be disposed on the lower surface of the barrier layer BR and may be electrically connected to the connection line CWL through the lead line LDL. The pad part PAD disposed on the lower surface of the barrier layer BR may be spaced apart from the second contact hole CNT2 in a plan view. The pad part PAD may receive various voltages or signals from the flexible film FPCB and supply the voltages or signals to the connection line CWL.

The flexible film FPCB may be disposed under or below the barrier layer BR. A side of the flexible film FPCB may be electrically connected to the pad part PAD through a connection film ACF, and the other side of the flexible film FPCB may be electrically connected to a source circuit board (not illustrated) under or below the barrier layer BR. The flexible film FPCB may transmit signals of the source driver SIC to the thin-film transistor layer TFTL.

FIGS. 19 through 23 are schematic cross-sectional views illustrating a process of manufacturing a display device 10 of FIG. 18. The display device manufacturing process of FIG. 19 may be a process following the display device manufacturing process of FIG. 5.

Figure 19:
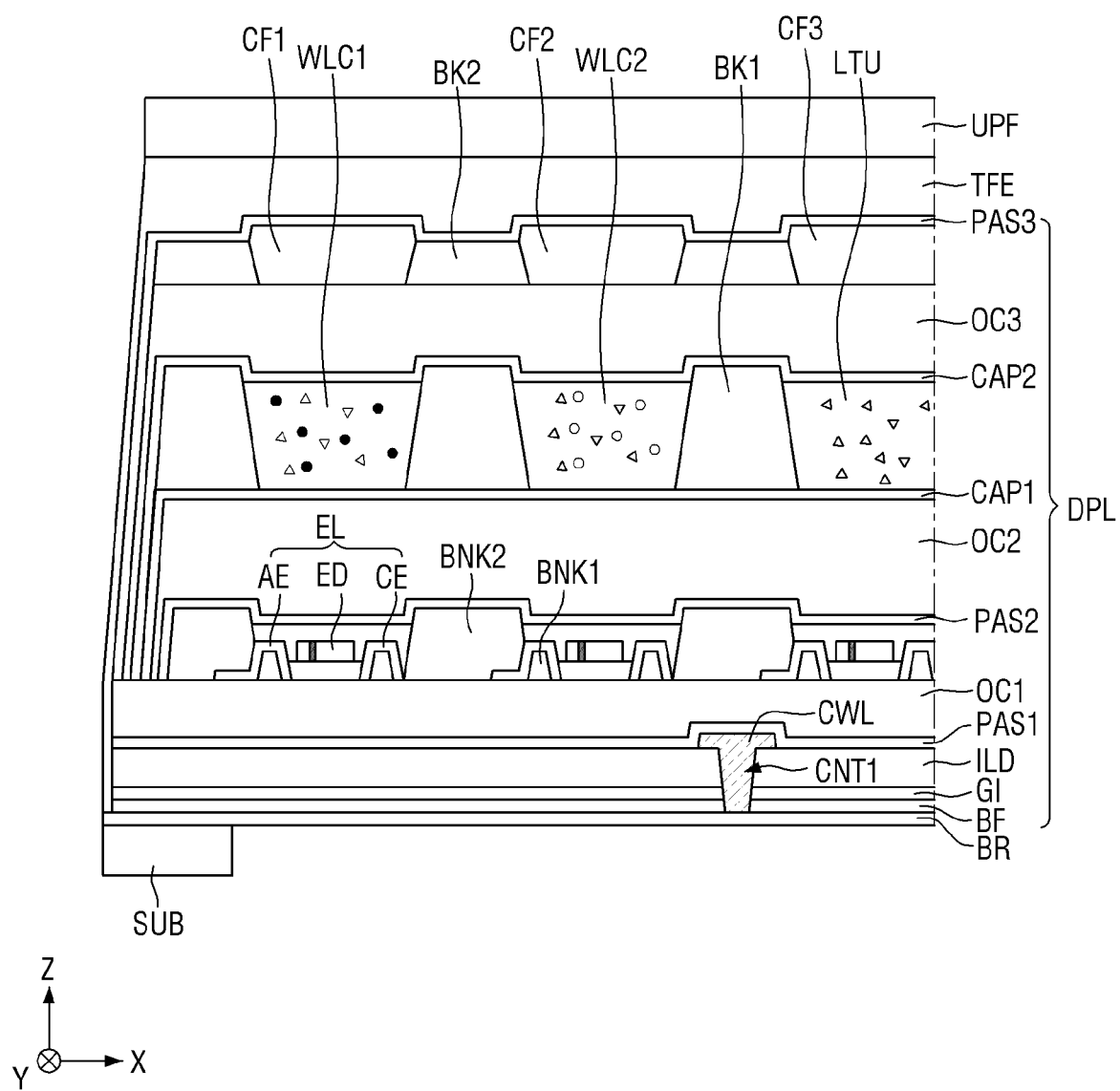
FIGS. 19 through 23 are schematic cross-sectional views illustrating a process of manufacturing a display device of FIG. 18.

In FIG. 19, an upper film UPF may be formed or disposed on an encapsulation layer TFE. For example, the upper film UPF may be, but is not limited to, a carrier glass or a protective film. The upper film UPF may support the display device 10 in the process of removing a barrier layer BR from a lower surface of a display layer DPL and forming a lead line LDL, a pad part PAD and a lower film LPF. After the upper film UPF is disposed, the display device being manufactured may be inverted. Accordingly, the upper film UPF may support the display device, and a carrier substrate CG may be exposed. The carrier substrate CG may be removed after the stacking of the display layer DPL and the encapsulation layer TFE is completed. A base part SUB excluding edges may be removed. For example, the base part SUB excluding the edges may be removed through at least one of a dry etching process, a wet etching process, a CMP process, and a laser etching process.

Figure 20:
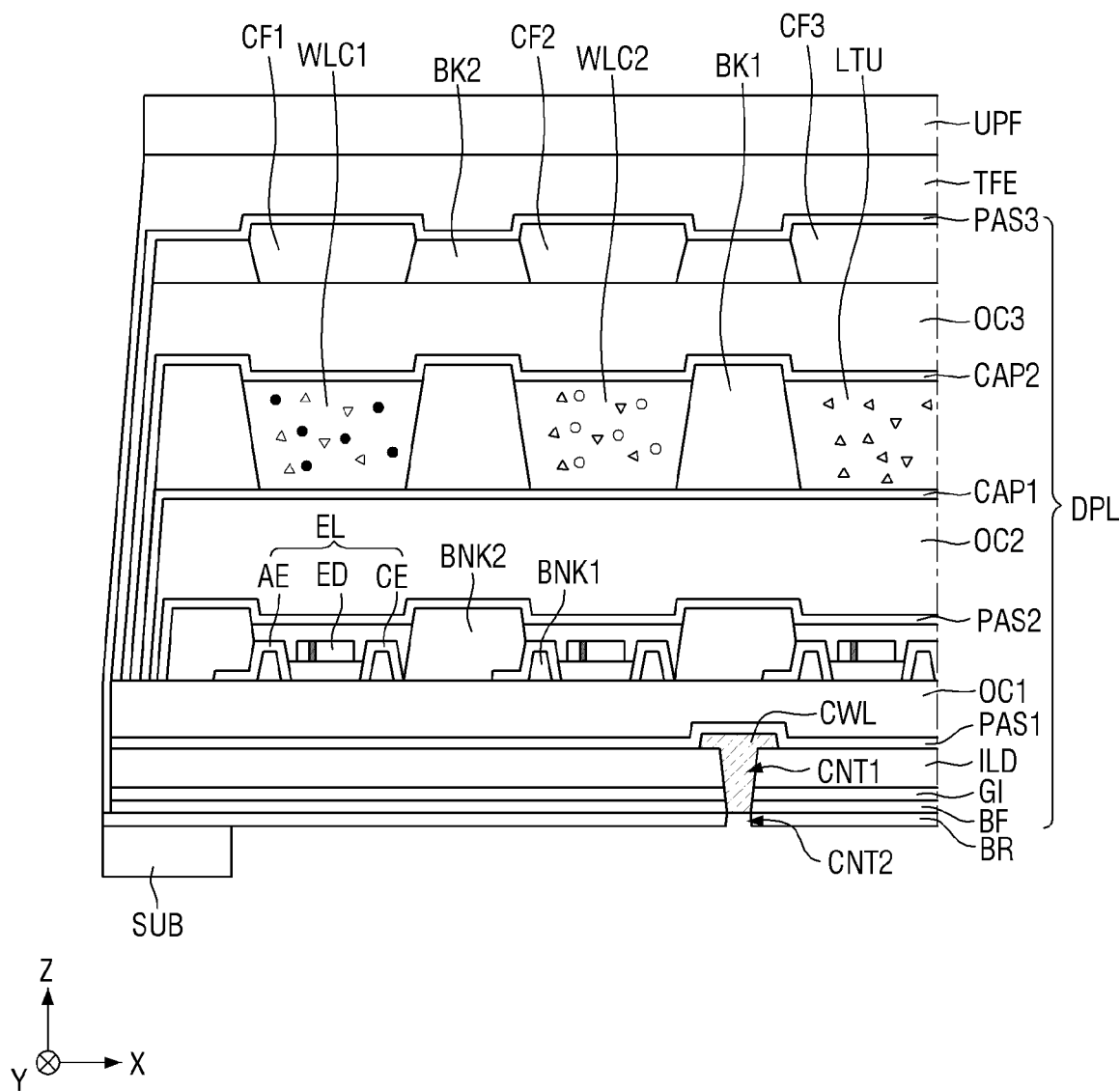

In FIG. 20, the barrier layer BR may include a second contact hole CNT2 connected to a first contact hole CNT1. The second contact hole CNT2 may penetrate the barrier layer BR to expose a connection line CWL inserted into the first contact hole CNT1.

Figure 21:
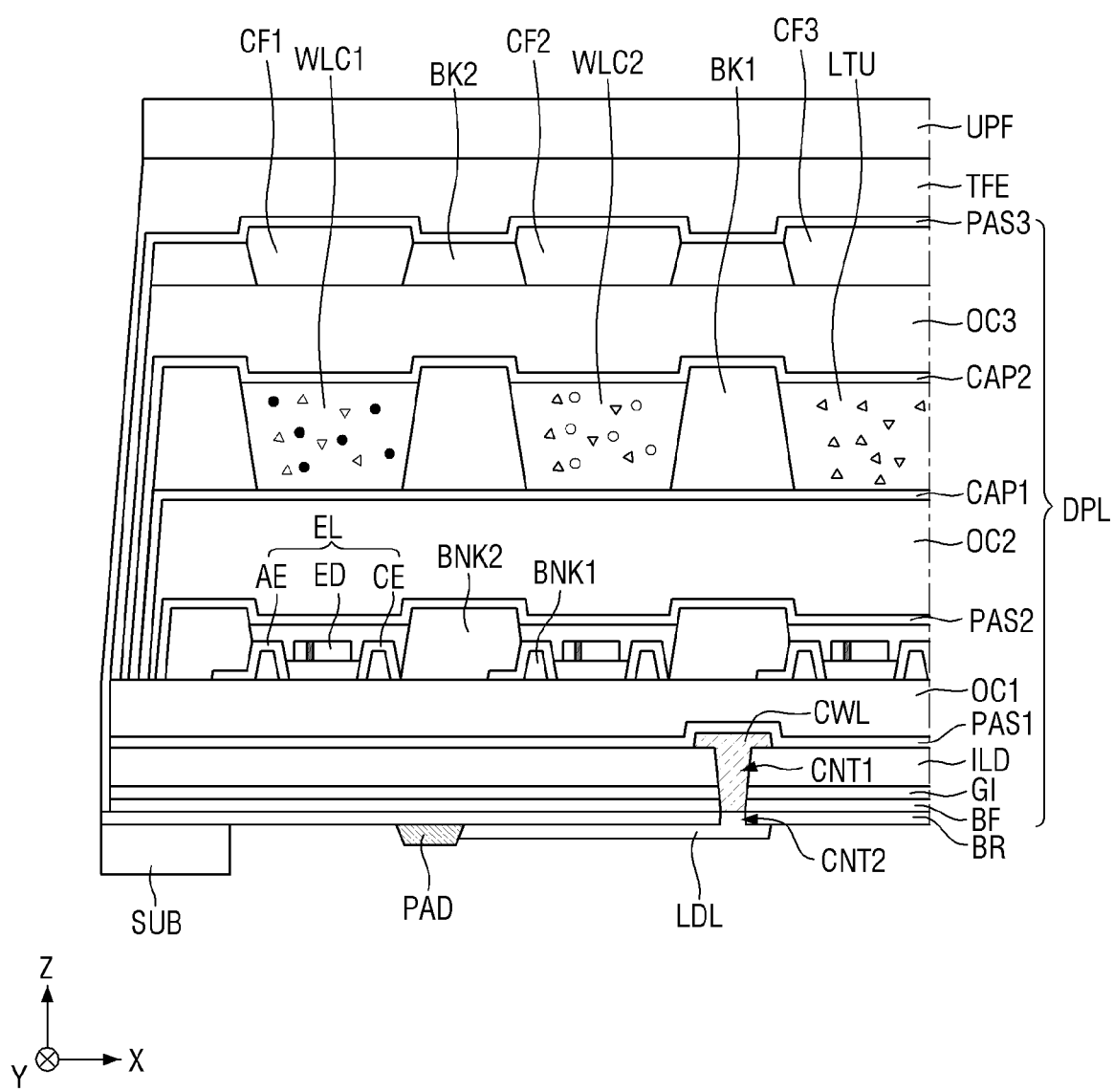

In FIG. 21, the lead line LDL and the pad part PAD may be formed or disposed on a lower surface of the barrier layer BR. The lead line LDL may be inserted into the second contact hole CNT2 and may be electrically connected to the connection line CWL exposed by the first contact hole CNT1. The lead line LDL may electrically connect the connection line CWL and the pad part PAD. The pad part PAD may be electrically connected to the connection line CWL through the lead line LDL.

Figure 22:
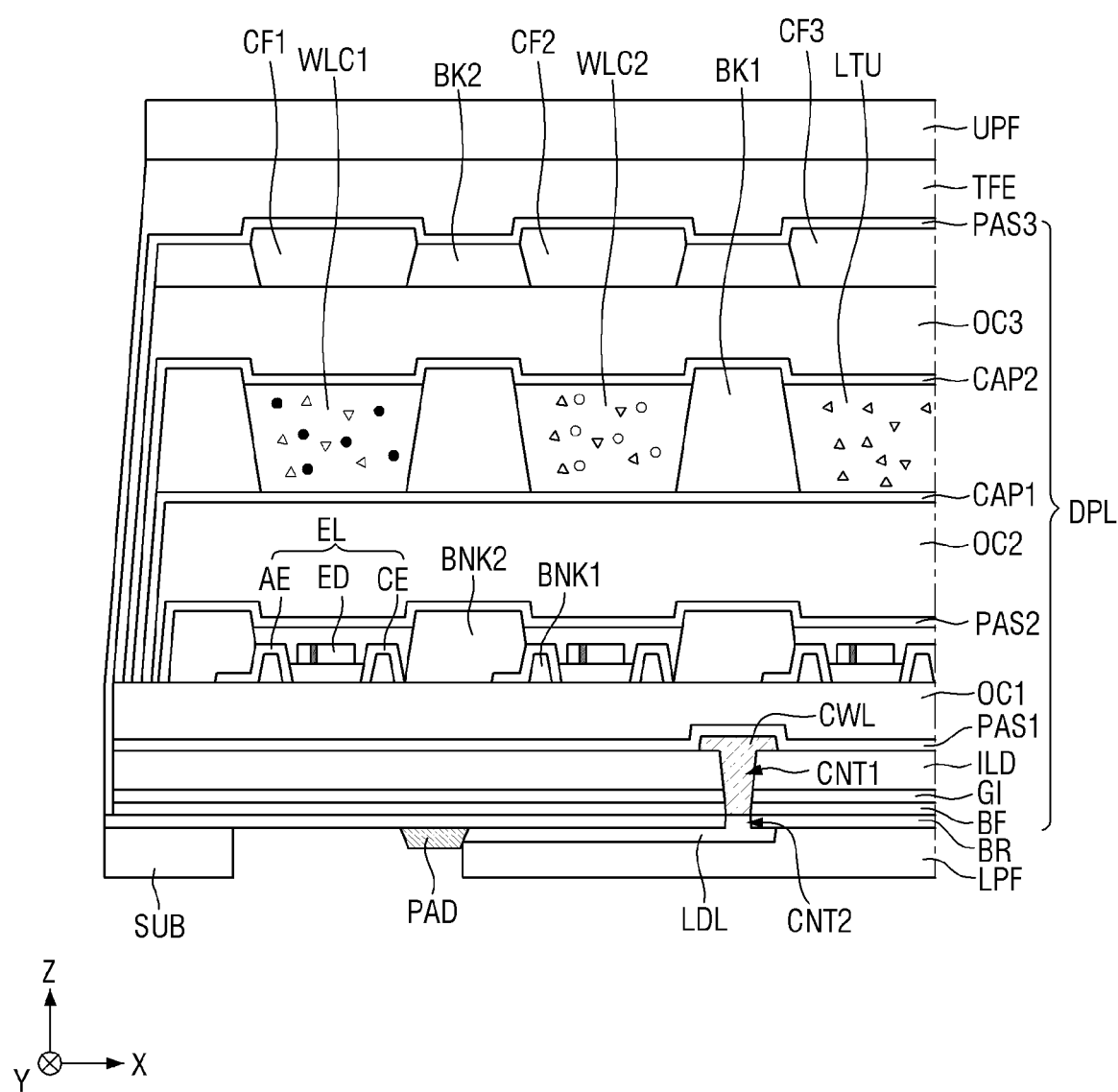

In FIG. 22, the lower film LPF may cover or overlap the lead line LDL and the lower surface of the barrier layer BR. For example, the lower film LPF may cover or overlap an area of the lower surface of the barrier layer BR in which the pad part PAD is not disposed. Therefore, the lower film LPF may protect the lead line LDL and a lower surface of the display device 10 and support the display device 10.

The lower film LPF may be formed through a printing process or a coating process using an organic material. For example, an organic material having fluidity may be provided or disposed on the lower surface of the display layer DPL through an inkjet printing process, a spin coating process, or a slit coating process. Here, the organic material having fluidity may have a low viscosity at which a considerable amount of the organic material is not detached from the lower surface of the display layer DPL. The organic material having fluidity may not be moved out of the display device 10 due to the base part SUB disposed on edges of the lower surface of the barrier layer BR. The lower film LPF may be stably disposed on the lower surface of the display layer DPL through an ultraviolet curing or thermal curing process of the organic material having fluidity.

In the tiled display device TD, since the lower film LPF is formed through a printing process or a coating process using an organic material, the lower surface of the display device 10 can be planarized, and a defect rate of the lower film LPF can be reduced. For example, in the tiled display device TD, since the lower film LPF is formed using an organic material having fluidity, a step difference of the lower film LPF can be removed, and generation of bubbles or creation of an area to which the lower film LPF is not attached can be prevented compared with when the lower film LPF is formed using a lamination process.

Figure 23:
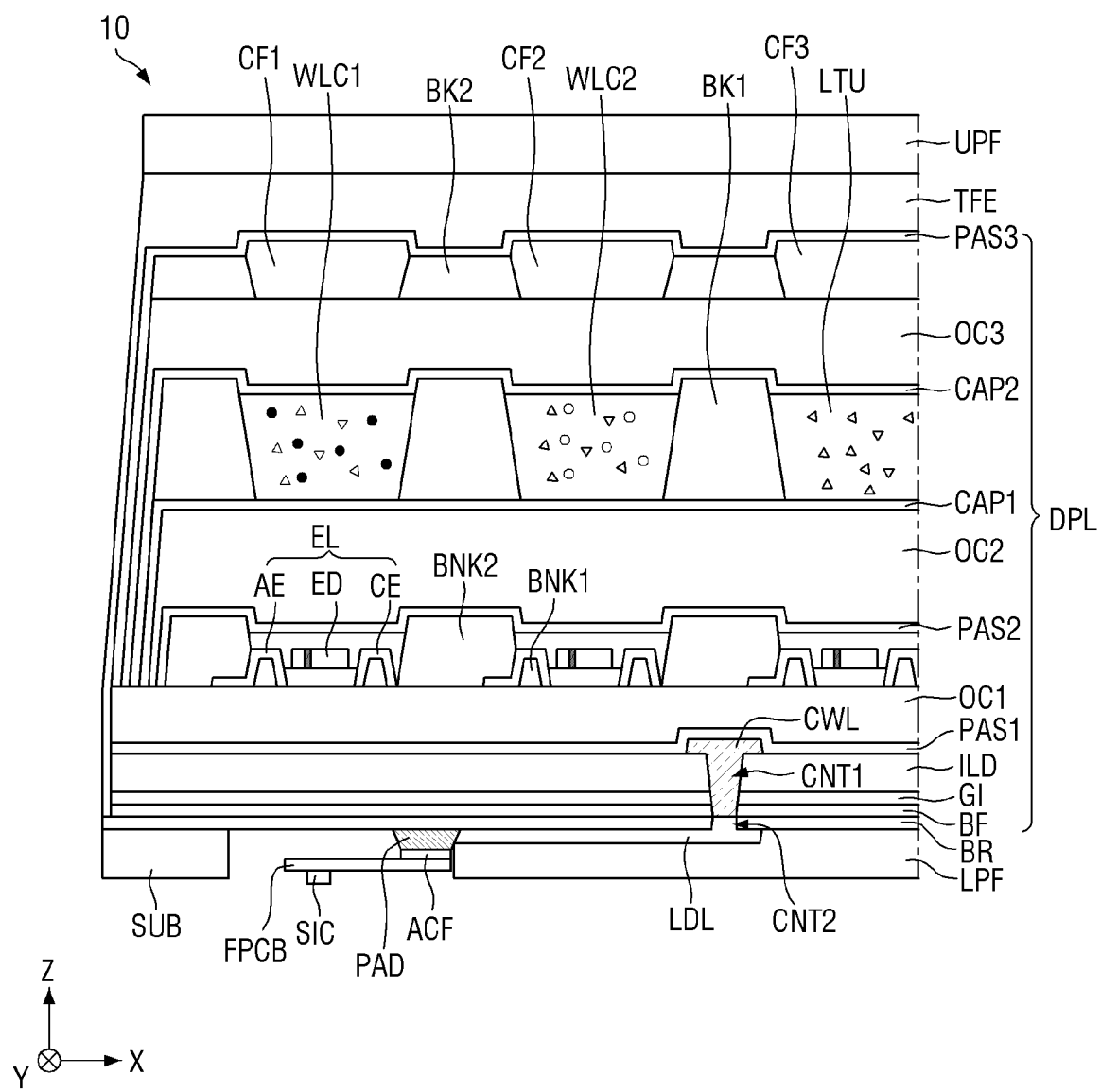

In FIG. 23, a flexible film FPCB may be disposed under or below the barrier layer BR. A side of the flexible film FPCB may be electrically connected to the pad part PAD through a connection film ACF, and the other side of the flexible film FPCB may be electrically connected to a source circuit board (not illustrated) under or below the barrier layer BR. The flexible film FPCB may transmit signals of a source driver SIC to a thin-film transistor layer TFTL.

Figure 24:
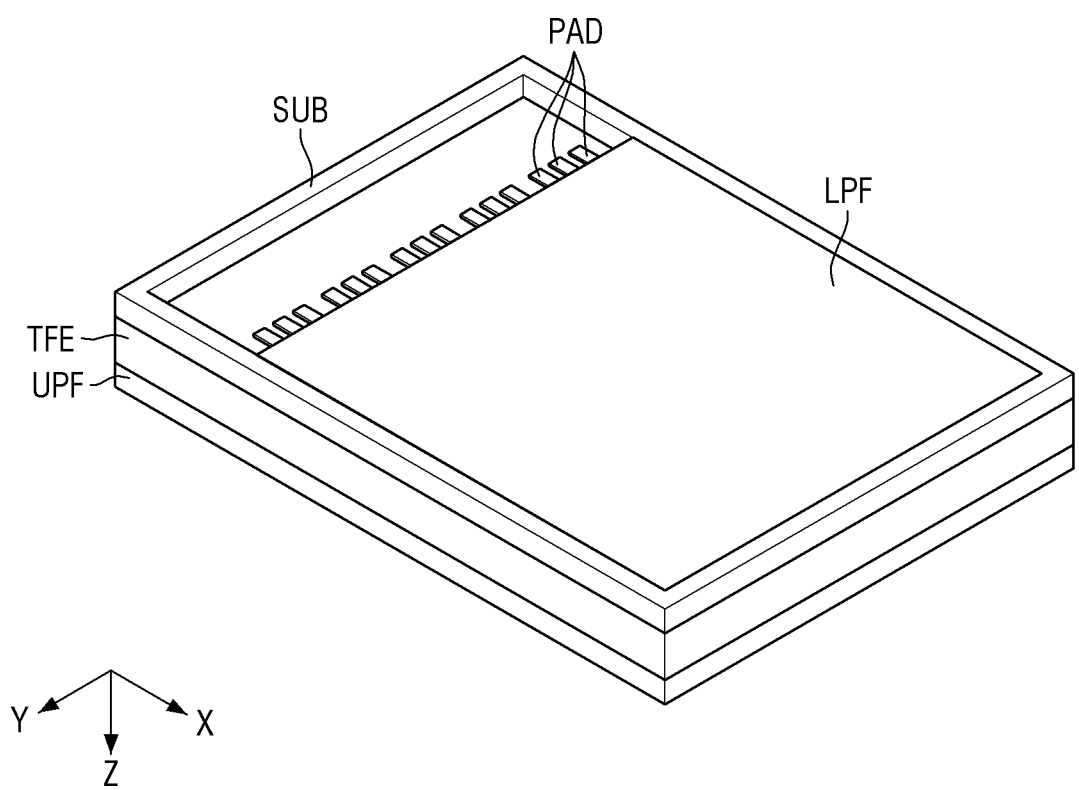
FIG. 24 is a rear perspective view of a display device of FIG. 18.

FIG. 24 is a rear perspective view of a display device 10 of FIG. 18.

Referring to FIG. 24, an upper film UPF may be formed or disposed on the encapsulation layer TFE. For example, the upper film UPF may be, but is not limited to, a carrier glass or a protective film. The upper film UPF may support the display device 10 in the process of removing a part of the base part SUB from the lower surface of the display layer DPL and forming the lead line LDL, the pad parts PAD and the lower film LPF. The base part SUB excluding edges may be removed. For example, the base part SUB excluding the edges may be removed through at least one of a dry etching process, a wet etching process, a CMP process, and a laser etching process.

The lower film LPF may support the display layer DPL encapsulated by the encapsulation layer TFE and may protect a lower surface of the display device 10. The lower film LPF may cover or overlap the lead line LDL and the lower surface of the barrier layer BR. For example, the lower film LPF may cover or overlap an area of the lower surface of the barrier layer BR in which the pad parts PAD may not be disposed. Therefore, the lower film LPF may protect the lead line LDL and the lower surface of the display device 10 and support the display device 10.

The base part SUB may be disposed on edges of the lower surface of the barrier layer BR. The base part SUB may surround the lower film LPF. The base part SUB may support edges of the display device 10 and prevent the lower film LPF from being moved out of the display device 10 in the process of forming the lower film LPF. For example, the base part SUB may surround or may directly surround some or a number of side surfaces of the lower film LPF and may surround another side surface of the lower film LPF at a distance. The base part SUB may include polyimide (PI). The pad parts PAD may be disposed in an area in which the lower film LPF and the base part SUB are spaced apart from each other.

Figure 25:
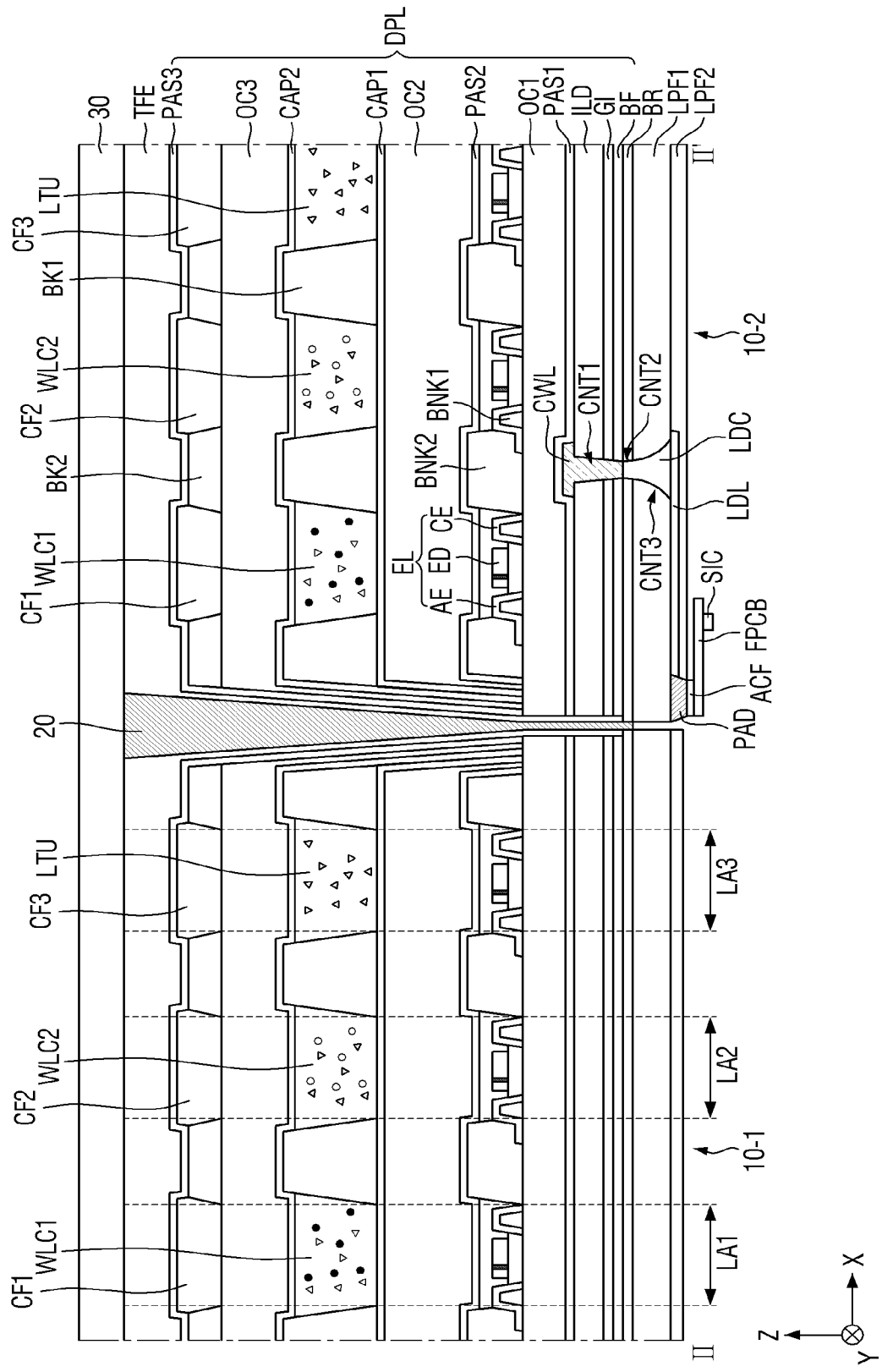
FIG. 25 is a schematic cross-sectional view taken along line II-II' of FIG. 1.

FIG. 25 is a schematic cross-sectional view taken along line II-II' of FIG. 1. A tiled display device TD of FIG. 25 may be different from the tiled display device TD of FIG. 11 in a first lower film LPF1, a read contact part LDC, and a second lower film LPF2. Thus, a description of the same elements as those described above will be given briefly or omitted.

Referring to FIG. 25, the tiled display device TD may include a plurality of display devices 10, a coupling member 20, and a cover member 30.

Each of the display devices 10 may include the first lower film LPF1, the second lower film LPF2, a barrier layer BR, a display layer DPL, an encapsulation layer TFE, a connection line CWL, the lead contact part LDC, a lead line LDL, a pad part PAD, a flexible film FPCB, and a source driver SIC.

The first lower film LPF1 may support the display layer DPL and protect a lower surface of each display device 10.

The first lower film LPF1 may cover or overlap a lower surface of the barrier layer BR. For example, the first lower film LPF1 may include at least one of acrylic resin, epoxy resin, phenolic resin, polyamides resin, unsaturated polyesters resin, polyphenylene ethers resin, polyphenylene sulfides resin, and benzocyclobutene resin or a combination thereof. The first lower film LPF1 may include a third contact hole CNT3 connected to a second contact hole CNT2 of the barrier layer BR. The third contact hole CNT3 may have, but is not limited to, a substantially funnel shape having a wide lower area and a narrow upper area.

The barrier layer BR may be disposed on the first lower film LPF1. The barrier layer BR may be disposed between the first lower film LPF1 and the display layer DPL to protect the bottom of the display layer DPL. The barrier layer BR may include the second contact hole CNT2 through which the lead contact part LDC may pass. The second contact hole CNT2 may be disposed between a first contact hole CNT1 and the third contact hole CNT3. The barrier layer BR may include an inorganic material that can prevent penetration of air or moisture.

The display layer DPL may be disposed on the barrier layer BR. The display layer DPL may include a thin-film transistor layer TFTL, a light emitting element layer EML, a wavelength conversion layer WLCL, and a color filter layer CFL.

The thin-film transistor layer TFTL may be disposed on the barrier layer BR. The thin-film transistor layer TFTL may include a buffer layer BF, thin-film transistors TFT, a gate insulating layer GI, an interlayer insulating film ILD, first connection electrodes CNE1, second connection electrodes CNE2, the connection line CWL, a first passivation layer PAS1, and a first planarization layer OC1.

The connection line CWL may be inserted into the first contact hole CNT1 and exposed on a lower surface of the display layer DPL. The connection line CWL may be exposed on a lower surface of the buffer layer BF. The connection line CWL may be electrically connected to the lead contact part LDC inserted into the second contact hole CNT2 and the third contact hole CNT3 and may be electrically connected to the pad part PAD through the lead line LDL electrically connected to the lead contact part LDC. The connection line CWL may supply an electrical signal received from the pad part PAD to the thin-film transistors TFT.

The lead contact part LDC may electrically connect the lead line LDL and the connection line CWL. The lead contact part LDC may be inserted into the third contact hole CNT3 of the first lower film LPF1 and the second contact hole CNT2 of the barrier layer BR. The lead contact part LDC may fill the third contact hole CNT3 of the first lower film LPF1 to planarize a lower surface of the first lower film LPF1. A lower surface of the lead contact part LDC and the lower surface of the first lower film LPF1 may lie in the same plane or may be coplanar.

The lead line LDL may be disposed on the lower surface of the first lower film LPF1 and may electrically connect the pad part PAD and the lead contact part LDC. For example, the lead line LDL may be integral with the pad part PAD, but the disclosure is not limited thereto. The lead line LDL may cover or overlap the third contact hole CNT3 and may be electrically connected to the lead contact part LDC inserted into the third contact hole CNT3. The lead line LDL may have, but is not limited to, a substantially spider shape.

The pad part PAD may be disposed on the lower surface of the first lower film LPF1 and may be electrically connected to the connection line CWL through the lead line LDL and the lead contact part LDC. The pad part PAD disposed on the lower surface of the first lower film LPF1 may be spaced apart from the third contact hole CNT3 in a plan view. The pad part PAD may receive various voltages or signals from the flexible film FPCB and supply the voltages or signals to the connection line CWL.

The second lower film LPF2 may cover or overlap the lead line LDL and the lower surface of the first lower film LPF1. For example, the second lower film LPF2 may cover or overlap an area of the lower surface of the first lower film LPF1 in which the pad part PAD is not disposed. Therefore, the second lower film LPF2 may protect the lead line LDL and the lower surface of each display device 10 and support each display device 10. For example, the second lower film LPF2 may include at least one of acrylic resin, epoxy resin, phenolic resin, polyamides resin, unsaturated polyesters resin, polyphenylene ethers resin, polyphenylene sulfides resin, and benzocyclobutene resin or a combination thereof.

The tiled display device TD may not include a separate substrate made of polyimide (PI) and may support the display layer DPL and protect the lower surface of each display device 10 through the first and second lower films LPF1 and LPF2. The first and second lower films LPF1 and LPF2 may include an organic material other than polyimide. In the tiled display device TD, a contact hole penetrating a polyimide substrate may not be formed in the process of manufacturing each display device 10, and a part of the polyimide substrate may not be etched. Therefore, since the tiled display device TD may not require all processes for precision processing of the polyimide substrate in the process of manufacturing each display device 10, the degree of freedom in processing the polyimide substrate can be increased.

The flexible film FPCB may be disposed under or below the second lower film LPF2. A side of the flexible film FPCB may be electrically connected to the pad part PAD through a connection film ACF, and the other side of the flexible film FPCB may be electrically connected to a source circuit board (not illustrated) under or below the second lower film LPF2. The flexible film FPCB may transmit signals of the source driver SIC to the thin-film transistor layer TFTL.

Figure 26:
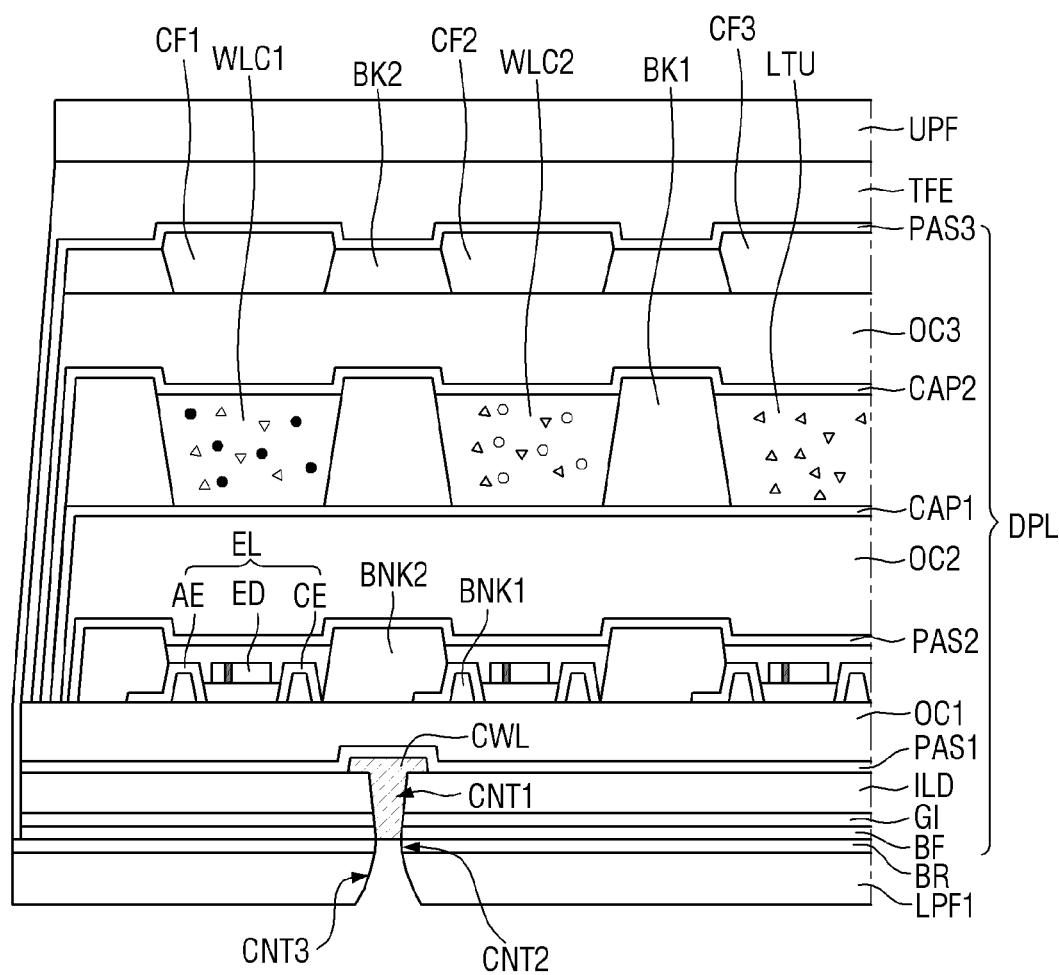
FIGS. 26 through 28 are schematic cross-sectional views illustrating a process of manufacturing a display device of FIG. 25.
Figure 27:
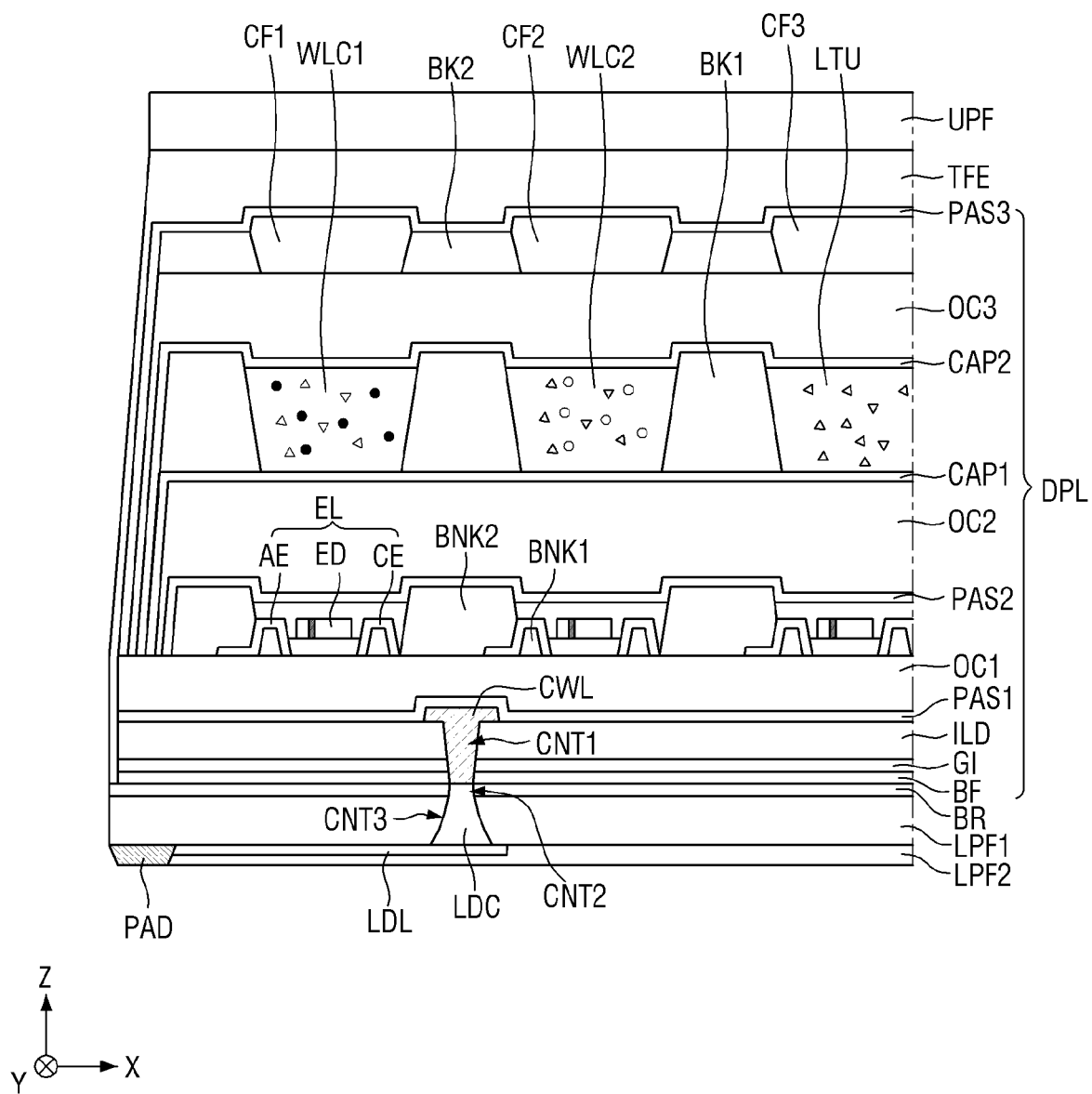
Figure 28:
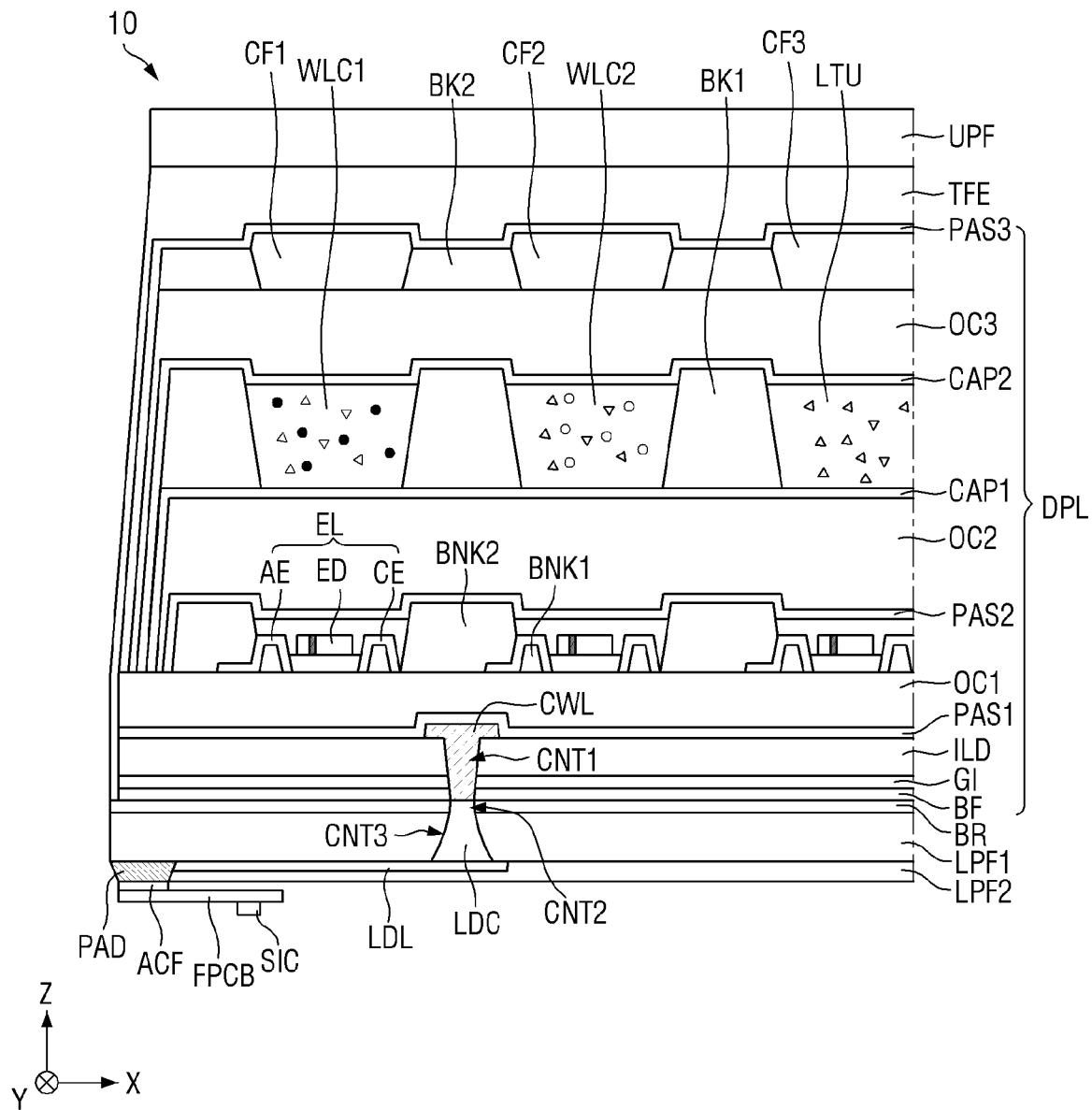

FIGS. 26 through 28 are schematic cross-sectional views illustrating a process of manufacturing a display device 10 of FIG. 25. The display device manufacturing process of FIG. 26 may be a process following the display device manufacturing process of FIG. 12.

In FIG. 26, a first lower film LPF1 may be formed or disposed on a lower surface of a barrier layer BR. The first lower film LPF1 may include a third contact hole CNT3 connected to a second contact hole CNT2 of the barrier layer BR. The third contact hole CNT3 may have, but is not limited to, a substantially funnel shape having a wide lower area and a narrow upper area.

The first lower film LPF1 may be formed through a printing process or a coating process using an organic material. For example, an organic material having fluidity may be provided or disposed on the lower surface of the barrier layer BR through an inkjet printing process, a spin coating process, or a slit coating process. Here, the organic material having fluidity may have a low viscosity at which a considerable amount of the organic material is not detached from the lower surface of the barrier layer BR. The first lower film LPF1 may be stably disposed on the lower surface of the barrier layer BR through an ultraviolet curing or thermal curing process of the organic material having fluidity. A small amount of the first lower film LPF1 which is detached from the lower surface of the barrier layer BR may be removed through a cutting process.

In FIG. 27, a lead contact part LDC may fill the third contact hole CNT3 of the first lower film LPF1 and the second contact hole CNT2 of the barrier layer BR. For example, the lead contact part LDC may include a metal material or a conductive material. The lead contact part LDC may planarize a lower surface of the first lower film LPF1. A lower surface of the lead contact part LDC and the lower surface of the first lower film LPF1 may lie in the same plane or may be coplanar.

A lead line LDL may be formed or disposed on the lower surface of the first lower film LPF1 and may electrically connect a pad part PAD and the lead contact part LDC. For example, the lead line LDL may be integral with the pad part PAD, but the disclosure is not limited thereto. The lead line LDL may cover or overlap the third contact hole CNT3 and may be electrically connected to the lead contact part LDC inserted into the third contact hole CNT3. The lead line LDL may have, but is not limited to, a substantially spider shape.

The pad part PAD may be formed or disposed on the lower surface of the first lower film LPF1 and may be electrically connected to the connection line CWL through the lead line LDL and the lead contact part LDC. The pad part PAD disposed on the lower surface of the first lower film LPF1 may be spaced apart from the third contact hole CNT3 in a plan view. The pad part PAD may receive various voltages or signals from a flexible film FPCB and supply the voltages or signals to the connection line CWL.

A second lower film LPF2 may cover or overlap the lead line LDL and the lower surface of the first lower film LPF1. For example, the second lower film LPF2 may cover or overlap an area of the lower surface of the first lower film LPF1 in which the pad part PAD is not disposed. Therefore, the second lower film LPF2 may protect the lead line LDL and a lower surface of the display device 10 and support the display device 10. The second lower film LPF2 may be formed through the same process as the first lower film LPF1 or through a process in the formation of the first lower film LPF1.

The tiled display device TD may not include a separate substrate made of polyimide (PI) and may support a display layer DPL and protect the lower surface of the display device 10 through the first and second lower films LPF1 and LPF2. The first and second lower films LPF1 and LPF2 may include an organic material other than polyimide. In the process of manufacturing the display device 10, a base part SUB made of polyimide (PI) may be completely removed, and a contact hole penetrating the base part SUB to electrically connect a connection line CWL and the pad part PAD may not be formed in the tiled display device TD. In the tiled display device TD, a part of the base part SUB may not be etched to electrically connect the connection line CWL and the pad part PAD. Therefore, since the tiled display device TD may not require all processes for precision processing of the base part SUB in the process of manufacturing the display device 10, the degree of freedom in processing the base part SUB can be increased.

In FIG. 28, the flexible film FPCB may be disposed under or below the second lower film LPF2. A side of the flexible film FPCB may be electrically connected to the pad part PAD, and the other side of the flexible film FPCB may be electrically connected to a source circuit board (not illustrated) under or below the second lower film LPF2. The flexible film FPCB may transmit signals of the source driver SIC to a thin-film transistor layer TFTL.

In a display device and a tiled display device including the same according to embodiments, a distance between respective display areas of a plurality of display devices may be small enough to make a coupling or connecting area between the display devices unrecognizable by a user. Therefore, the tiled display device may eliminate a sense of separation between the display devices and improve the degree of immersion in images by preventing the coupling or connecting area between the display devices from being recognized by a user.

What is claimed is:

1. A display device comprising:
    a display layer comprising a plurality of pixels, each of the plurality of pixels having at least one thin-film transistor;
    a connection line electrically connected to the at least one thin-film transistor, the connection line being exposed on a lower surface of the display layer through a first contact hole formed in the display layer;
    a barrier layer disposed on the lower surface of the display layer and including a second contact hole connected to the first contact hole;
    a lead line disposed on a lower surface of the barrier layer and electrically connected to the connection line through the second contact hole;
    a pad part disposed on the lower surface of the barrier layer and electrically connected to the lead line, the pad part and the lead line being directly disposed on a same lower surface of a same layer; and
    a lower film overlapping the lower surface of the barrier layer and the lead line.

2. The display device of claim 1, further comprising:
    a flexible film disposed on a surface of the pad part; and
    a source driver that supplies a source voltage to the pad part and is disposed on a surface of the flexible film.

3. The display device of claim 1, wherein the lower film includes at least one of acrylic resin, epoxy resin, phenolic resin, polyamides resin, unsaturated polyesters resin, polyphenylene ethers resin, polyphenylene sulfides resin, and benzocyclobutene resin.

4. The display device of claim 1, wherein the barrier layer includes at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

5. The display device of claim 2, wherein the display layer comprises:
    a buffer layer disposed on another surface of the pad part opposite the surface of the pad part;
    a gate insulating layer disposed on the buffer layer; and
    an interlayer insulating film disposed on the gate insulating layer,
    wherein the connection line is disposed on the interlayer insulating film and exposed on the lower surface of the display layer through the first contact hole penetrating the interlayer insulating film, the gate insulating layer and the buffer layer.

6. The display device of claim 5, wherein
    the at least one thin-film transistor comprises a source electrode disposed on the buffer layer, and
    the display layer comprises a connection electrode disposed on the interlayer insulating film to electrically connect the source electrode to the connection line.

7. The display device of claim 1, further comprising a light blocking film including a light blocking material and overlapping a lower surface of the lower film.

8. The display device of claim 1, further comprising a base part disposed on edges of the lower surface of the barrier layer, wherein the base part surrounds the lower film.

9. The display device of claim 8, wherein the base part includes polyimide.

10. The display device of claim 8, wherein the pad part is disposed between the lower film and the base part.

11. The display device of claim 10, further comprising:
    a flexible film disposed on a surface of the pad part; and
    a source driver that supplies a source voltage to the pad part and is disposed on a surface of the flexible film.

12. A display device comprising:
    a display layer comprising a plurality of pixels, each of the plurality of pixels having at least one thin-film transistor;
    a connection line electrically connected to the at least one thin-film transistor, the connection line being exposed on a lower surface of the display layer through a contact hole formed in the display layer;
    a pad part disposed on the lower surface of the display layer and spaced apart from the contact hole;
    a lead line disposed on the lower surface of the display layer and electrically connected between the connection line and the pad part, the pad part and the lead line being directly disposed on a same lower surface of a same layer; and
    a lower film overlapping the lower surface of the display layer and the lead line.

13. The display device of claim 12, further comprising:
    a flexible film disposed on a surface of the pad part; and
    a source driver that supplies a source voltage to the pad part and is disposed on a surface of the flexible film.

14. A tiled display device comprising:
    a plurality of display devices comprising:
    a plurality of display areas having pixels; and
    a connecting area disposed between adjacent ones of the plurality of display areas,
    wherein each of the display devices comprises:
    a display layer comprising a plurality of pixels, each of the plurality of pixels having at least one thin-film transistor;
    a connection line electrically connected to the at least one thin-film transistor, the connection line being exposed on a lower surface of the display layer through a first contact hole formed in the display layer;
    a barrier layer disposed on the lower surface of the display layer and including a second contact hole connected to the first contact hole;
    a lead line disposed on a lower surface of the barrier layer and electrically connected to the connection line through the second contact hole;
    a pad part disposed on the lower surface of the barrier layer and electrically connected to the lead line, the pad part and the lead line being directly disposed on a same lower surface of a same layer; and
    a lower film overlapping the lower surface of the barrier layer and the lead line.

15. The tiled display device of claim 14, wherein each of the plurality of display devices comprises a light blocking film including a light blocking material and overlapping a lower surface of the lower film.

16. The tiled display device of claim 14, wherein each of the plurality of display devices comprises a base part disposed on edges of the lower surface of the barrier layer, wherein the base part surrounds the lower film.

17. The display device of claim 1, wherein the connection line is disposed on an interlayer insulating film of the display layer.

18. The display device of claim 1, wherein the lower film overlapping the lower surface of the barrier layer in which the pad part is not disposed.

19. The display device of claim 1, wherein the pad part and the lead line are directly disposed on the lower surface of the barrier layer.

* * * * *